US012683579B2

(12) United States Patent
Ouchi

(10) Patent No.: US 12,683,579 B2
(45) Date of Patent: Jul. 14, 2026

(54) ACOUSTIC WAVE DEVICE INCLUDING ELECTRODE FILMS WITH DIFFERENT SURFACE ANGLES AND WIDTHS

(71) Applicant: Murata Manufacturing Co., Ltd., Nagaokakyo (JP)

(72) Inventor: Minefumi Ouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 529 days.

(21) Appl. No.: 18/109,897

(22) Filed: Feb. 15, 2023

(65) Prior Publication Data

US 2023/0198495 A1     Jun. 22, 2023

Related U.S. Application Data

(63) Continuation of application No. PCT/JP2021/029920, filed on Aug. 16, 2021.

(60) Provisional application No. 63/070,923, filed on Aug. 27, 2020.

(51) Int. Cl.
H03H 9/13 (2006.01)

(52) U.S. Cl.
CPC ............ H03H 9/132 (2013.01); H03H 9/131 (2013.01)

(58) Field of Classification Search
CPC .......... H03H 9/02086; H03H 9/02039; H03H 9/131; H03H 9/132; H03H 9/56; H03H 9/02015; H03H 9/02157; H03H 9/174; H03H 9/02228
USPC ......... 333/133, 186–188, 193–196; 310/311, 310/313
See application file for complete search history.

(56) References Cited

U.S. PATENT DOCUMENTS

| 6,707,229 B1 | 3/2004 | Martin |
|---|---|---|
| 7,135,940 B2 | 11/2006 | Kawakubo et al. |
| 8,344,815 B2 | 1/2013 | Yamanaka |
| 9,130,145 B2 | 9/2015 | Martin et al. |

(Continued)

FOREIGN PATENT DOCUMENTS

| CN | 112352382 A | 2/2021 |
|---|---|---|
| CN | 116131802 A | 5/2023 |

(Continued)

OTHER PUBLICATIONS

International Search Report in PCT/JP2021/029920, mailed Nov. 2, 2021, 3 pages.

(Continued)

*Primary Examiner* — Andrea Lindgren Baltzell
*Assistant Examiner* — Victor Cole
(74) *Attorney, Agent, or Firm* — Keating & Bennett, LLP

(57) ABSTRACT

An acoustic wave device includes a piezoelectric layer including first and second main surfaces and made of lithium niobate or lithium tantalate, and an interdigital transducer electrode on the first main surface and including multiple electrode fingers. d/p is about 0.5 or less where d is a thickness of the piezoelectric layer, and p is a distance between centers of adjacent electrode fingers. The electrode fingers include first and second electrode films, which include first and second surfaces and a side surface. $\Theta 1 \neq \Theta 2$ is satisfied and W1>W2 is satisfied, where $\Theta 1$ and $\Theta 2$ are angles between the side surfaces and the first surfaces of the first and second electrode films, and W1 and W2 are widths of the first and second electrode films.

14 Claims, 13 Drawing Sheets

(56)          References Cited

U.S. PATENT DOCUMENTS

| | | | |
|---|---|---|---|
| 10,491,192 | B1 | 11/2019 | Plesski et al. |
| 10,601,392 | B2 | 3/2020 | Plesski et al. |
| 10,637,438 | B2 | 4/2020 | Garcia et al. |
| 10,826,462 | B2 | 11/2020 | Plesski et al. |
| 10,868,513 | B2 | 12/2020 | Yantchev |
| 11,916,540 | B2 | 2/2024 | Yantchev |
| 2007/0001549 | A1 | 1/2007 | Kando |
| 2009/0121584 | A1* | 5/2009 | Nishimura ......... H03H 9/14541 |
| | | | 310/313 B |
| 2010/0102669 | A1 | 4/2010 | Yamanaka |
| 2011/0109196 | A1 | 5/2011 | Goto et al. |
| 2011/0199163 | A1 | 8/2011 | Yamanaka |
| 2013/0057360 | A1 | 3/2013 | Meltaus et al. |
| 2014/0145556 | A1 | 5/2014 | Kadota |
| 2014/0232239 | A1* | 8/2014 | Iwasaki .............. H03H 9/02984 |
| | | | 310/313 C |
| 2016/0182009 | A1 | 6/2016 | Bhattacharjee |
| 2016/0285430 | A1 | 9/2016 | Kikuchi et al. |
| 2017/0077902 | A1 | 3/2017 | Daimon |
| 2017/0155373 | A1* | 6/2017 | Ruby ................. H03H 9/02574 |
| 2017/0214387 | A1 | 7/2017 | Burak et al. |
| 2017/0370791 | A1 | 12/2017 | Nakamura et al. |
| 2018/0097501 | A1 | 4/2018 | Kikuchi et al. |
| 2019/0068164 | A1 | 2/2019 | Houlden et al. |
| 2019/0123721 | A1 | 4/2019 | Takamine |
| 2019/0372551 | A1 | 12/2019 | Daimon et al. |
| 2019/0386633 | A1* | 12/2019 | Plesski .................... H03H 9/54 |
| 2019/0386635 | A1 | 12/2019 | Plesski et al. |
| 2020/0021271 | A1 | 1/2020 | Plesski |
| 2020/0091893 | A1 | 3/2020 | Plesski et al. |
| 2021/0006228 | A1 | 1/2021 | Garcia |
| 2021/0013859 | A1 | 1/2021 | Turner et al. |
| 2021/0013868 | A1 | 1/2021 | Plesski et al. |
| 2022/0014172 | A1 | 1/2022 | Nozoe |
| 2022/0216842 | A1 | 7/2022 | Nagatomo et al. |
| 2022/0231661 | A1 | 7/2022 | Mchugh et al. |

FOREIGN PATENT DOCUMENTS

| | | | | |
|---|---|---|---|---|
| JP | | H10209804 A | | 8/1998 |
| JP | | 2010103803 A | | 5/2010 |
| JP | | 2013528996 A | | 7/2013 |
| JP | | 2018050135 A | * | 3/2018 |
| WO | | 2010047114 A1 | | 4/2010 |
| WO | | 2012137027 A1 | | 10/2012 |
| WO | | 2013021948 A1 | | 2/2013 |
| WO | | 2015098694 A1 | | 7/2015 |
| WO | | 2015182521 A1 | | 12/2015 |
| WO | | 2016017104 A1 | | 2/2016 |
| WO | | 2017013945 A1 | | 1/2017 |
| WO | | 2018003273 A1 | | 1/2018 |
| WO | | 2018155305 A1 | | 8/2018 |
| WO | | 2019241174 A1 | | 12/2019 |
| WO | | 2020100949 A1 | | 5/2020 |
| WO | | 2021060523 A1 | | 4/2021 |

OTHER PUBLICATIONS

Written Opinion in PCT/JP2021/029920, mailed Nov. 2, 2021, 4 pages.
International Search Report and Written Opinion for PCT Application No. PCT/US2022/081095, mailed May 30, 2023, 12 pages.
International Search Report and Written Opinion for PCT Application No. PCT/US2019/036433, mailed Aug. 29, 2019, 9 pages.
International Search Report and Written Opinion for PCT Application No. PCT/US2022/080246, mailed Mar. 30, 2023, 9 pages.

* cited by examiner

FIRST EMBODIMENT (50°)    SECOND COMPARATIVE EXAMPLE

FIRST EMBODIMENT (60°)    FIRST COMPARATIVE EXAMPLE

ACOUSTIC WAVE DEVICE INCLUDING ELECTRODE FILMS WITH DIFFERENT SURFACE ANGLES AND WIDTHS

CROSS REFERENCE TO RELATED APPLICATIONS

This application claims the benefit of priority to Provisional Application No. 63/070,923 filed on Aug. 27, 2020 and is a Continuation application of PCT Application No. PCT/JP2021/029920 filed on Aug. 16, 2021. The entire contents of each application are hereby incorporated herein by reference.

BACKGROUND OF THE INVENTION

1. Field of the Invention

The present invention relates to an acoustic wave device.

2. Description of the Related Art

Acoustic wave devices are commonly used for, for example, filters of cellular phones. In recent years, an acoustic wave device that uses a bulk wave in a thickness-shear mode has been proposed as disclosed in U.S. Pat. No. 10,491,192. In the acoustic wave device, a pair of electrodes are provided on a piezoelectric layer. The pair of electrodes face each other on the piezoelectric layer and are connected to different electric potentials. An alternating voltage is applied across the electrodes, and consequently, the bulk wave in the thickness-shear mode is excited.

Where the bulk wave in the thickness-shear mode is used, the pitch of the electrodes is likely to increase, and a duty ratio is likely to decrease. For this reason, element capacitance is difficult to increase. In some cases, an increase in the duty ratio causes a spurious emission.

SUMMARY OF THE INVENTION

Preferred embodiments of the present invention provide acoustic wave devices that are each able to increase capacitance and reduce a spurious emission.

An acoustic wave device according to a preferred embodiment of the present invention includes a piezoelectric layer that includes a first main surface and a second main surface facing away from each other and that is made of lithium niobate or lithium tantalate, and an interdigital transducer electrode that is provided on the first main surface of the piezoelectric layer and that includes a plurality of electrode fingers. d/p is about 0.5 or less, where d is a thickness of the piezoelectric layer, and p is a distance between centers of adjacent electrode fingers of the plurality of electrode fingers. The plurality of electrode fingers include a first electrode film and a second electrode film on the first electrode film. The first electrode film and the second electrode film each include a first surface and a second surface facing away from each other in a thickness direction and a side surface connected to the first surface and the second surface. $\Theta 1 \neq \Theta 2$ is satisfied, and $W1 > W2$ is satisfied, where $\Theta 1$ is an angle between the side surface and the first surface of the first electrode film, $\Theta 2$ is an angle between the side surface and the first surface of the second electrode film, W1 is a width of the first electrode film, and W2 is a width of the second electrode film.

A filter device according to a preferred embodiment of the present invention includes a plurality of acoustic wave resonators. Each of the plurality of acoustic wave resonators is an acoustic wave device according to a preferred embodiment of the present invention. The angle $\Theta 2$ differs between at least two of the plurality of acoustic wave resonators.

A filter device according to a preferred embodiment of the present invention includes a plurality of acoustic wave resonators. Each of the plurality of acoustic wave resonators is an acoustic wave device according to a preferred embodiment of the present invention. A ratio $W1/W2$ between the width W1 of the first electrode film and the width W2 of the second electrode film differs between at least two of the acoustic wave resonators.

According to preferred embodiments of the present invention, acoustic wave devices each with an increased capacitance and a reduced spurious emission are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will hereinafter be clarified by describing specific preferred embodiments of the present invention with reference to the drawings.

The preferred embodiments will be described in the present specification by way of examples, and structures can be partially replaced or combined among the different preferred embodiments.

Figure 1:
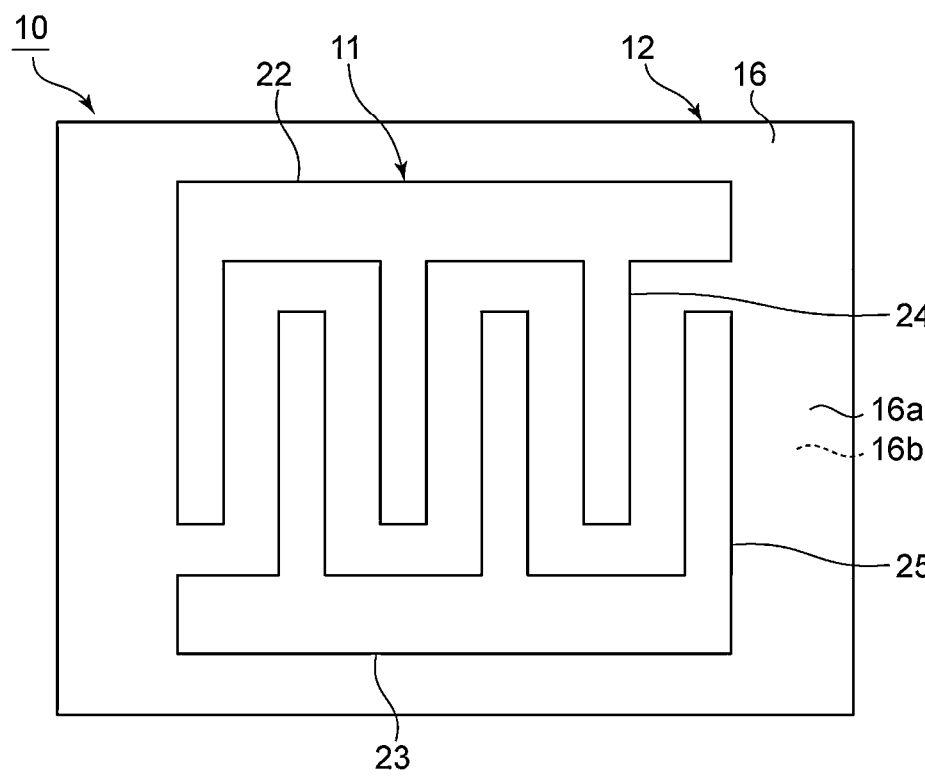
FIG. 1 is a plan view of an acoustic wave device according to a first preferred embodiment of the present invention.
Figure 2:
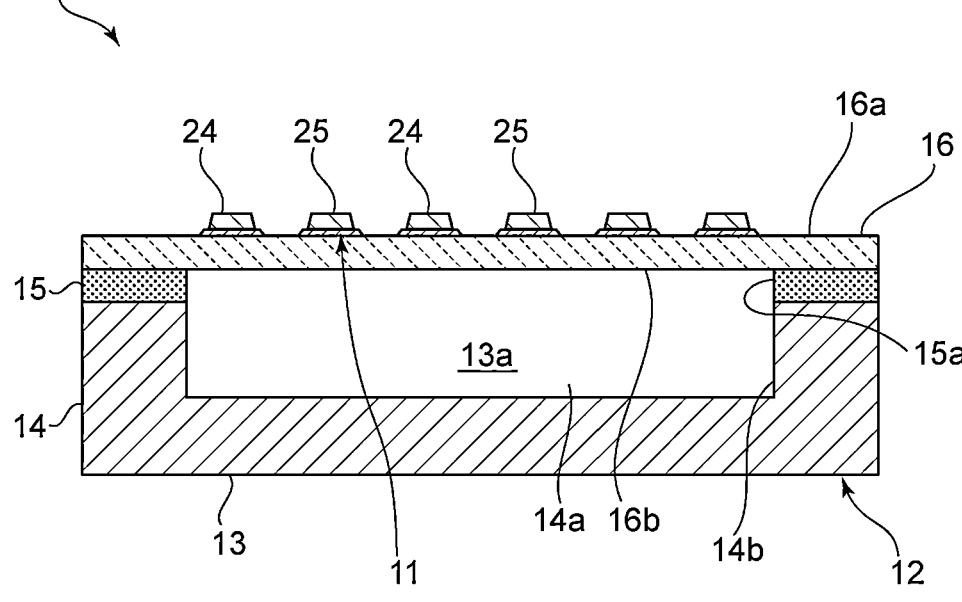
FIG. 2 is an elevational cross-sectional view of the acoustic wave device according to the first preferred embodiment of the present invention.

FIG. 1 is a plan view of an acoustic wave device according to a first preferred embodiment of the present invention. FIG. 2 is an elevational cross-sectional view of the acoustic wave device according to the first preferred embodiment.

As illustrated in FIG. 1, an acoustic wave device 10 includes a piezoelectric substrate 12 and an interdigital transducer electrode 11. As illustrated in FIG. 2, the piezoelectric substrate 12 includes a support member 13 and a piezoelectric layer 16. According to the present preferred embodiment, the support member 13 includes a support substrate 14 and an electrically insulating layer 15. In the piezoelectric substrate 12, the electrically insulating layer 15 is provided on the support substrate 14. The piezoelectric layer 16 is provided on the electrically insulating layer 15.

The piezoelectric layer 16 includes a first main surface 16a and a second main surface 16b. The first main surface 16a and the second main surface 16b face away from each other. Of the first main surface 16a and the second main surface 16b, the second main surface 16b faces the support member 13. According to the present preferred embodiment, the piezoelectric layer 16 is, for example, a lithium niobate layer. More specifically, the piezoelectric layer 16 is, for example, a LiNbO$_3$ layer. However, the piezoelectric layer 16 may be a lithium tantalate layer such as a LiTaO$_3$ layer, for example.

As illustrated in FIG. 1, the interdigital transducer electrode 11 is provided on the first main surface 16a of the piezoelectric layer 16. The interdigital transducer electrode 11 includes a first busbar 22, a second busbar 23, multiple first electrode fingers 24, and multiple second electrode fingers 25. The first busbar 22 and the second busbar 23 face each other. The first electrode fingers 24 correspond to first electrodes. The multiple first electrode fingers 24 are periodically arranged. An end of each of the multiple first electrode fingers 24 is connected to the first busbar 22. The second electrode fingers 25 correspond to second electrodes. The multiple second electrode fingers 25 are periodically arranged. An end of each of the multiple second electrode fingers 25 is connected to the second busbar 23. The multiple first electrode fingers 24 and the multiple second electrode fingers 25 are interdigitated with each other.

In the following description, the first electrode fingers 24 and the second electrode fingers 25 are simply referred to as the electrode fingers in some cases. In the present specification, a direction in which the multiple electrode fingers extend is referred to as an electrode finger extension direction. For the electrode fingers, a direction perpendicular or substantially perpendicular to the electrode finger extension direction is referred to as a width direction. A direction toward the center of each electrode finger is referred to as an inward direction in the width direction, and a direction away from the center is referred to as an outward direction in the width direction.

In the acoustic wave device 10, an acoustic wave is excited by applying an alternating voltage to the interdigital transducer electrode 11. The acoustic wave device 10 is structured so as to be capable of using a thickness-shear mode. More specifically, according to the present preferred embodiment, for example, a first thickness-shear mode can be used.

Figure 3:
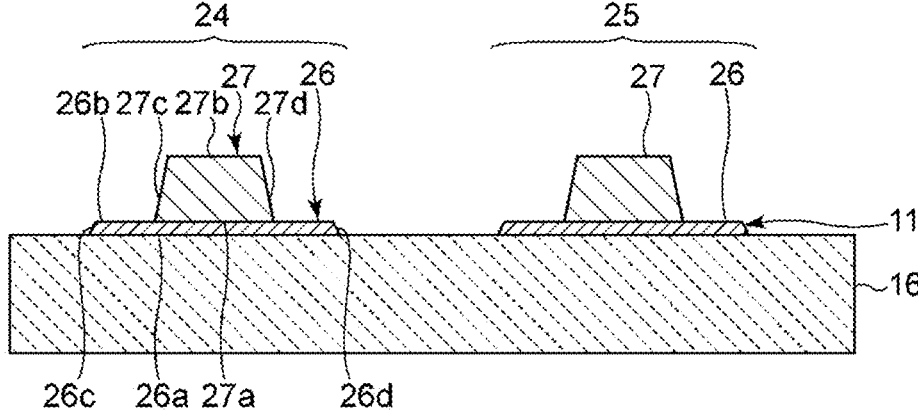
FIG. 3 is an elevational cross-sectional view illustrating the vicinity of a pair of electrode fingers according to the first preferred embodiment of the present invention.
Figure 4:
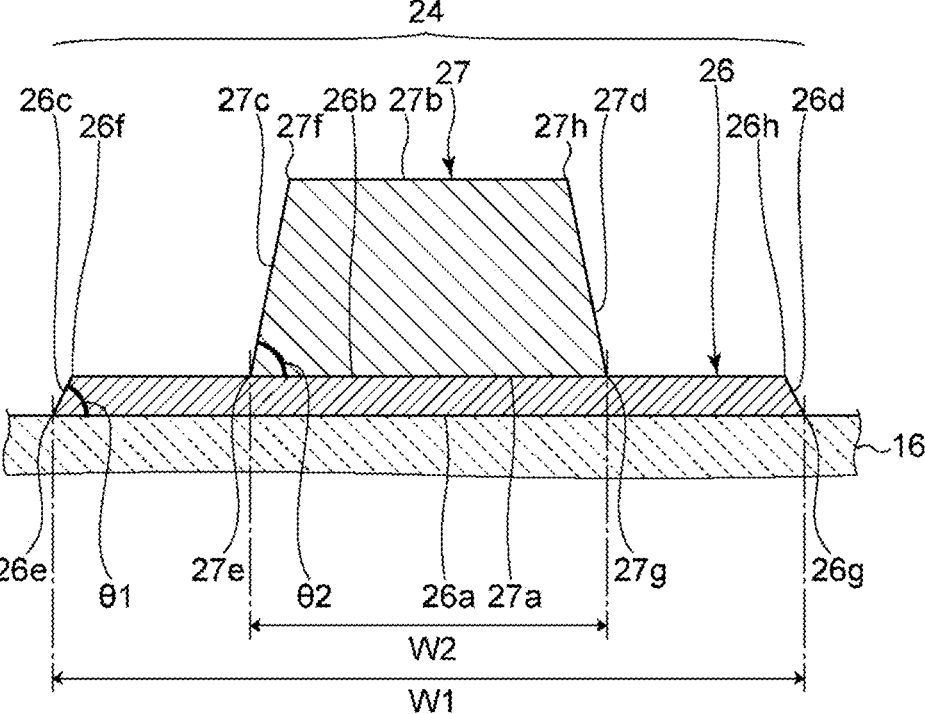
FIG. 4 is an enlarged view of FIG. 3.

FIG. 3 is an elevational cross-sectional view illustrating the vicinity of a pair of electrode fingers according to the first preferred embodiment. FIG. 4 is an enlarged view of FIG. 3.

As illustrated in FIG. 3, each first electrode finger 24 includes a first electrode film 26 and a second electrode film 27. The first electrode finger 24 is defined by a multilayer film including the first electrode film 26 and the second electrode film 27. More specifically, the first electrode film 26 is provided on the piezoelectric layer 16. The second electrode film 27 is provided on the first electrode film 26. Each second electrode finger 25 is defined by the same multilayer film including the first electrode film 26 and the second electrode film 27 as the first electrode finger 24.

As illustrated in FIG. 4, each first electrode film 26 includes a first surface 26a, a second surface 26b, a first side surface 26c, and a second side surface 26d. The first surface 26a and the second surface 26b face away from each other in a thickness direction. Of the first surface 26a and the second surface 26b, the first surface 26a faces the piezoelectric layer 16. The first side surface 26c and the second side surface 26d are connected to the first surface 26a and the second surface 26b. The first side surface 26c and the second side surface 26d face away from each other in the width direction. The first side surface 26c and the second side surface 26d extend obliquely with respect to the thickness direction of each electrode finger. In an example illustrated in FIG. 4 according to the present preferred embodiment, $\Theta1 < 90°$ is satisfied where $\Theta1$ is an angle between the first side surface 26c and the first surface 26a. An angle between the second side surface 26d and the first surface 26a may be $\Theta1$. According to the present preferred embodiment, the angle between the first side surface 26c and the first surface 26a is equal or substantially equal to the angle between the second side surface 26d and the first surface 26a.

Each second electrode film 27 includes a first surface 27a, a second surface 27b, a first side surface 27c, and a second side surface 27d. The first surface 27a and the second surface 27b face away from each other in the thickness direction. Of the first surface 27a and the second surface 27b, the first surface 27a faces the piezoelectric layer 16. The first side surface 27c and the second side surface 27d are connected to the first surface 27a and the second surface 27b. The first side surface 27c and the second side surface 27d face away from each other in the width direction. The first side surface 27c and the second side surface 27d extend obliquely with respect to the thickness direction of each electrode finger. In the example illustrated in FIG. 4 according to the present preferred embodiment, $\Theta2 < 90°$ is satisfied where $\Theta2$ is an angle between the first side surface 27c and the first surface 27a. An angle between the second side surface 27d and the first surface 27a may be $\Theta2$. According to the present preferred embodiment, the angle between the first side surface 27c and the first surface 27a is equal or substantially equal to the angle between the second side surface 27d and the first surface 27a.

As described above, $\Theta1 \neq 90°$ is satisfied, and $\Theta2 \neq 90°$ is satisfied. For this reason, the widths of the first electrode film 26 and the second electrode film 27 are not uniform in the thickness direction. In the following description, the width of each electrode film of the electrode fingers is the maximum width of the electrode film accordingly, unless otherwise particularly described. That is, the width of the first electrode film 26 is equal or substantially equal to the width of the first surface 26a of the first electrode film 26. The width of the second electrode film 27 is equal or substantially equal to the width of the first surface 27a of the second electrode film 27.

Figure 5:
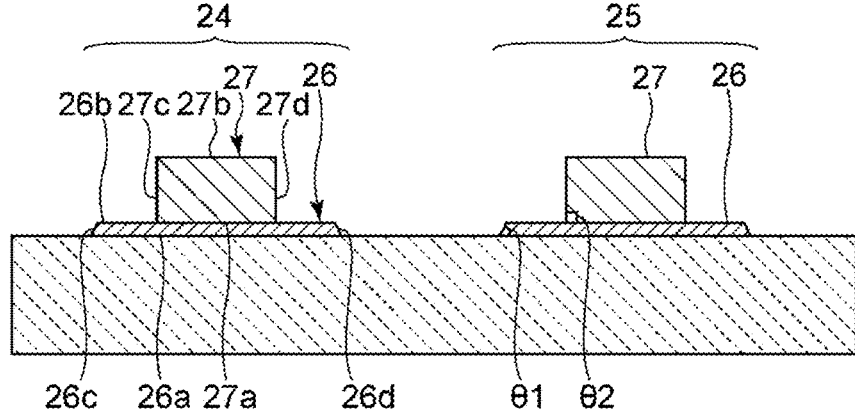
FIG. 5 is an elevational cross-sectional view illustrating an example in which an angle $\Theta 2$ of a second electrode film according to the first preferred embodiment of the present invention is about 90°.
Figure 6:
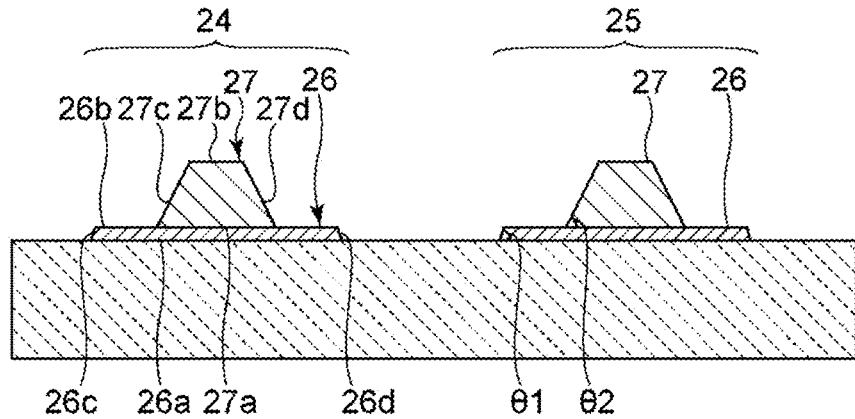
FIG. 6 is an elevational cross-sectional view illustrating an example in which the angle $\Theta 2$ of the second electrode film according to the first preferred embodiment of the present invention is smaller than an angle $\Theta 1$ of a first electrode film.

As in an example illustrated in FIG. 5, $\Theta2 =$ about 90° may be satisfied. In the example illustrated in FIG. 4, $\Theta1 < \Theta2$ is satisfied. As in an example illustrated in FIG. 6, however, $\Theta1 > \Theta2$ may be satisfied.

Features according to the present preferred embodiment are that $\Theta1 \neq \Theta2$ is satisfied, and $W1 > W2$ is satisfied where W1 is the width of the first electrode film 26, and W2 is the width of the second electrode film 27. This enables the acoustic wave device 10 to increase element capacitance and to reduce a spurious emission. The details thereof will now be described by comparing the present preferred embodiment, a first comparative example, and a second comparative example.

The first comparative example and the second comparative example differ from the first preferred embodiment in that $\Theta1 = \Theta2$ is satisfied, and the width of a second surface of each first electrode film is equal or substantially equal to the width of a first surface of each second electrode film. The width of each electrode finger differs between the first comparative example and the second comparative example. Specifically, the width of each electrode finger in the second comparative example is greater than the width of each electrode finger in the first comparative example. The width of the first electrode film in the second comparative example is equal or substantially equal to the width of the first electrode film according to the first preferred embodiment.

In a simulation, impedance frequency characteristics are compared among the first preferred embodiment, the first comparative example, and the second comparative example. The design parameters of the acoustic wave device according to the first preferred embodiment are as follows. An electrode finger pitch described below means a distance between the centers of adjacent electrode fingers.

Piezoelectric layer; material . . . $Z\text{-Cut-LiNbO}_3$, thickness . . . about 0.4 μm First electrode film; material . . . Ti, thickness . . . about 0.01 μm, width . . . about 1.6 μm, angle $\Theta1$ . . . about 50°

Second electrode film; material . . . Al, thickness . . . about 0.49 μm, width . . . about 0.9 μm, angle $\Theta2$ . . . about 80°

Electrode finger pitch; about 3.775 μm

The design parameters of the acoustic wave device in the first comparative example are as follows.

Piezoelectric layer; material . . . $Z\text{-Cut-LiNbO}_3$, thickness . . . about 0.4 μm First electrode film; material . . . Ti, thickness . . . about 0.01 μm, width . . . about 1.4 μm, angle $\Theta1$ . . . about 80°

Second electrode film; material . . . Al, thickness . . . about 0.49 μm, angle $\Theta2$ . . . about 80°

Electrode finger pitch; about 3.775 μm

The design parameters in the second comparative example are the same or substantially the same as the design parameters in the first comparative example, except that the width of the first electrode film is about 1.6 μm.

Figure 7:
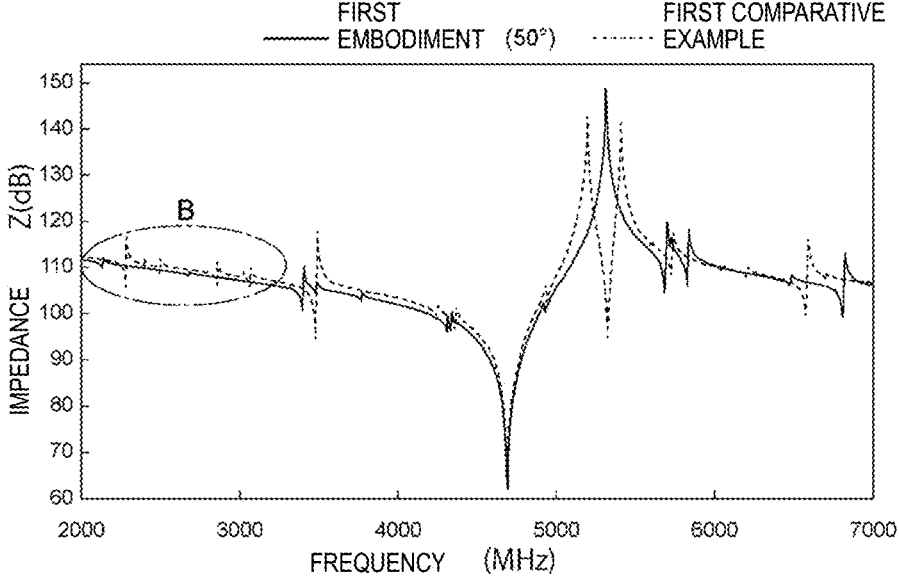
FIG. 7 illustrates impedance frequency characteristics of the acoustic wave device according to the first preferred embodiment of the present invention and those in a first comparative example.
Figure 8:
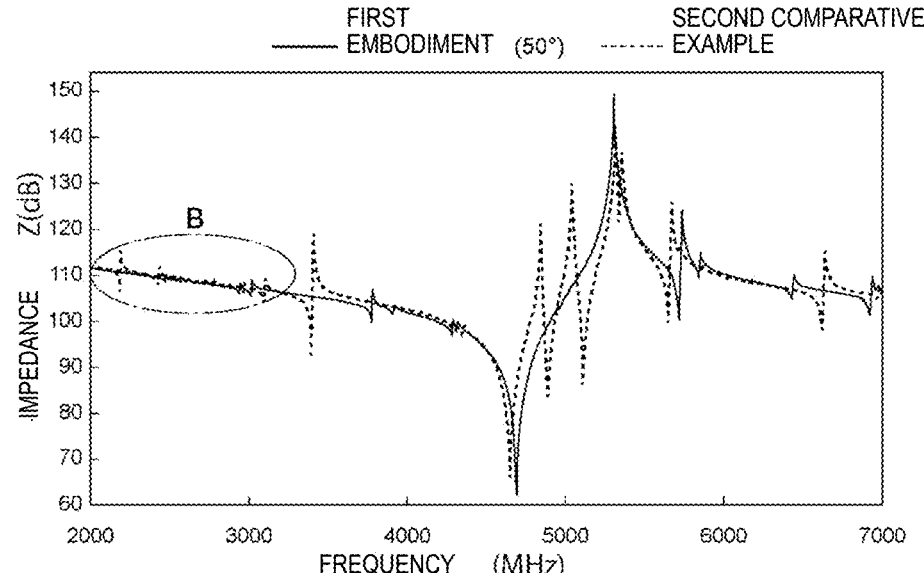
FIG. 8 illustrates the impedance frequency characteristics of the acoustic wave device according to the first preferred embodiment of the present invention and those in a second comparative example.

FIG. 7 illustrates impedance frequency characteristics of the acoustic wave device according to the first preferred embodiment and those in the first comparative example. FIG. 8 illustrates the impedance frequency characteristics of the acoustic wave device according to the first preferred embodiment and those in the second comparative example. As impedance decreases, the element capacitance increases. Band widths B surrounded by dashed lines in FIG. 7 and FIG. 8 are examples of a band width for comparing the impedance.

As illustrated in FIG. 7, a spurious emission occurs in the first comparative example. In contrast, according to the first preferred embodiment, a spurious emission is reduced. According to the first preferred embodiment, the impedance is lower than that in the first comparative example. That is, according to the first preferred embodiment, the element capacitance can be higher than that in the first comparative example.

According to the first preferred embodiment, each electrode finger is defined by the multilayer body of the first electrode film 26 and the second electrode film 27. The value of the width W1 of the first electrode film 26 is large, and consequently, the element capacitance can be increased. The value of the width W2 of the second electrode film 27 is small, and consequently, the spurious emission can be reduced.

The width W1 of the first electrode film 26 according to the first preferred embodiment is greater than the width of the electrode finger in the first comparative example. Consequently, the element capacitance according to the first preferred embodiment is higher than the element capacitance in the first comparative example. Also, in the first comparative example, the width of the electrode finger is sufficiently increased to increase the element capacitance. This causes the spurious emission. According to the first preferred embodiment, however, the spurious emission is reduced as described above.

As illustrated in FIG. 8, it is understood that according to the first preferred embodiment, the spurious emission can be reduced more than in the second comparative example. The impedance according to the first preferred embodiment is equal or substantially equal to the impedance in the second comparative example. That is, according to the first preferred embodiment, the element capacitance is as high as the element capacitance in the second comparative example.

The width of the electrode finger in the second comparative example is greater than the width of the electrode finger in the first comparative example. In the second comparative example, this causes the spurious emission in a larger amount than that in the first comparative example. According to the first preferred embodiment, the width W1 of the first electrode film 26 is equal or substantially equal to the width of the first electrode film in the second comparative example. According to the first preferred embodiment, however, W1>W2 is satisfied as illustrated in FIG. 4. This enables the spurious emission to be reduced although the element capacitance according to the first preferred embodiment can be as high as that in the second comparative example.

As a result of consideration conducted by the present inventor, it has been discovered that as for the design parameters described above, a change in the angle Θ1 of the first electrode film 26 only slightly affects the electrical characteristics of the acoustic wave device 10. It has also been discovered that in the case where the angle Θ2 of the second electrode film 27 is changed, the impedance frequency characteristics change. In view of this, the impedance frequency characteristics in the case where the angle Θ2 is changed are illustrated in FIG. 9 to FIG. 12. Specifically, the angle Θ2 is repeatedly changed by about 10° in the range of no less than about 60° and no more than about 90°. In any case described above, Θ1≠Θ2 is satisfied. In FIG. 9 to FIG. 12, the result of the first comparative example is illustrated together.

Figure 9:
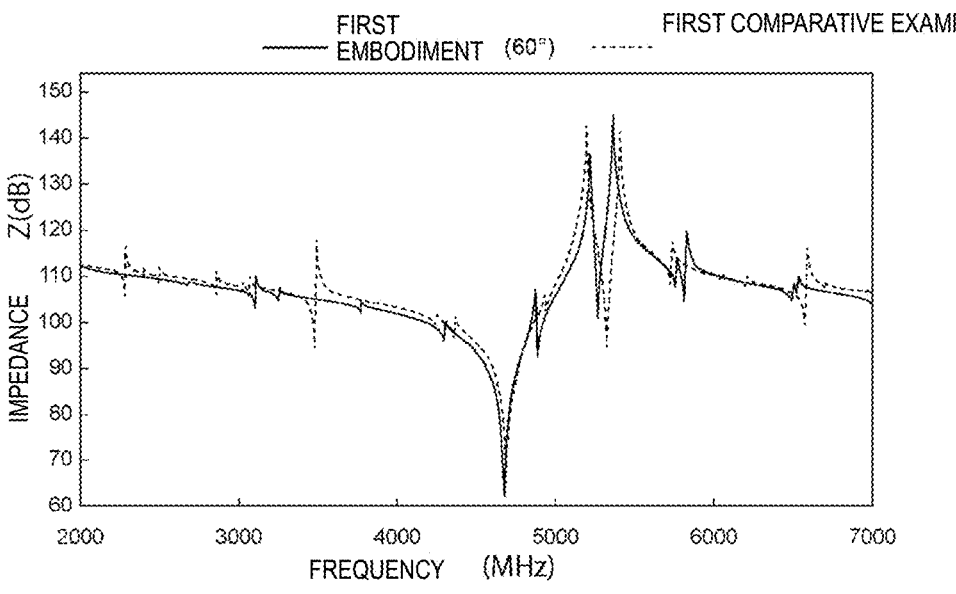
FIG. 9 illustrates the impedance frequency characteristics of the acoustic wave device according to the first preferred embodiment of the present invention in the case where the angle $\Theta 2$ is about 60° and the impedance frequency characteristics in the first comparative example.
Figure 10:
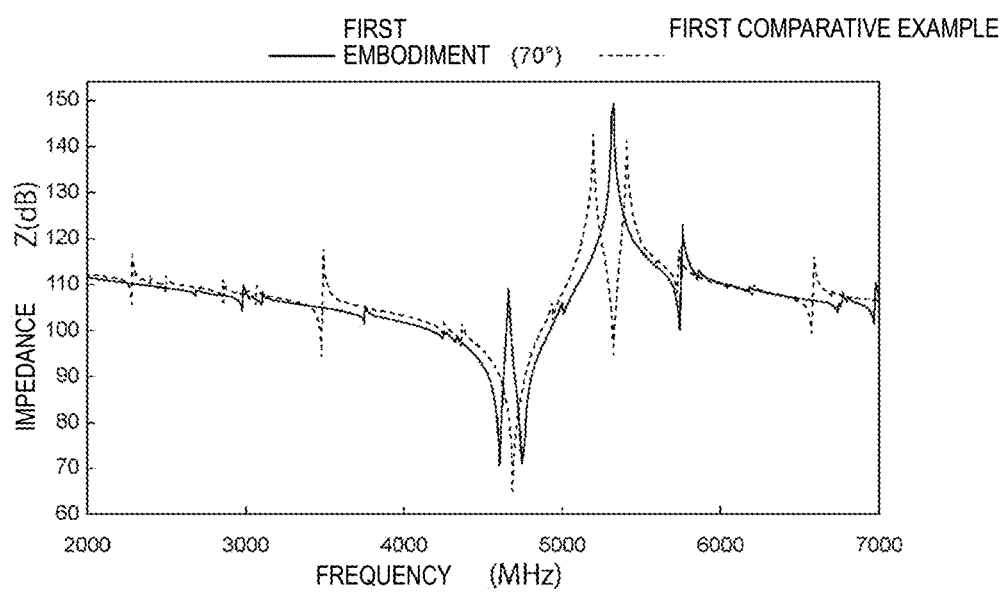
FIG. 10 illustrates the impedance frequency characteristics of the acoustic wave device according to the first preferred embodiment of the present invention in the case where the angle $\Theta 2$ is about 70° and the impedance frequency characteristics in the first comparative example.
Figure 11:
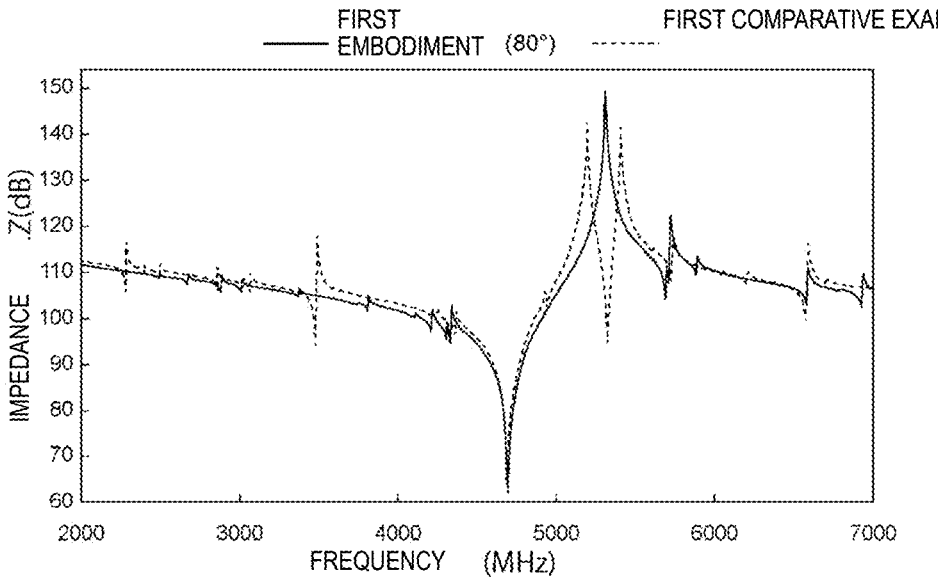
FIG. 11 illustrates the impedance frequency characteristics of the acoustic wave device according to the first preferred embodiment of the present invention in the case where the angle $\Theta 2$ is about 80° and the impedance frequency characteristics in the first comparative example.
Figure 12:
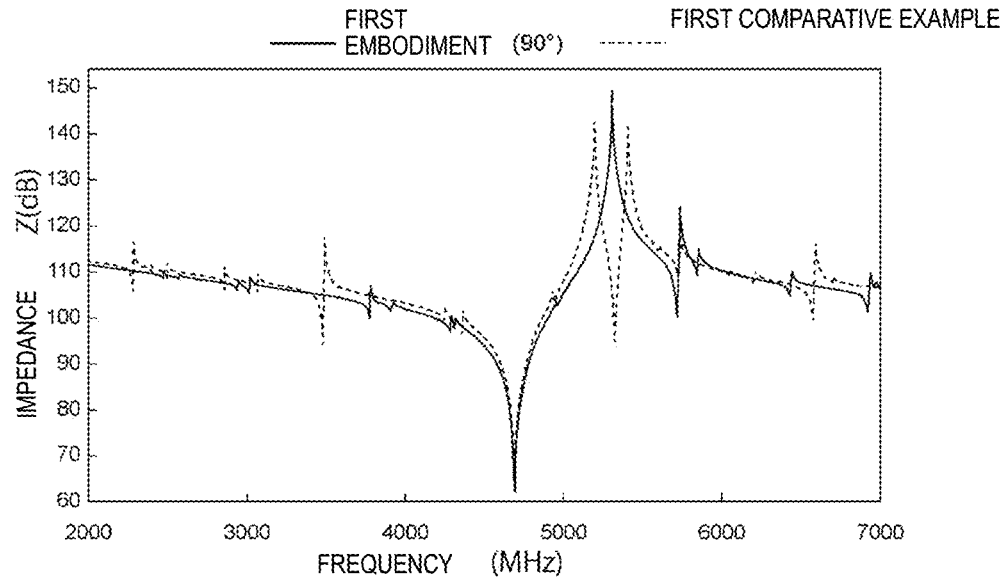
FIG. 12 illustrates the impedance frequency characteristics of the acoustic wave device according to the first preferred embodiment of the present invention in the case where the angle $\Theta 2$ is about 90° and the impedance frequency characteristics in the first comparative example.

FIG. 9 illustrates the impedance frequency characteristics of the acoustic wave device according to the first preferred embodiment in the case where the angle Θ2 is about 60° and the impedance frequency characteristics in the first comparative example. FIG. 10 illustrates the impedance frequency characteristics of the acoustic wave device according to the first preferred embodiment in the case where the angle Θ2 is about 70° and the impedance frequency characteristics in the first comparative example. FIG. 11 illustrates the impedance frequency characteristics of the acoustic wave device according to the first preferred embodiment in the case where the angle Θ2 is about 80° and the impedance frequency characteristics in the first comparative example. FIG. 12 illustrates the impedance frequency characteristics of the acoustic wave device according to the first preferred embodiment in the case where the angle Θ2 is about 90° and the impedance frequency characteristics in the first comparative example.

Also, according to the first preferred embodiment, as illustrated in FIG. 9, a spurious emission occurs in the case where the angle Θ2 is about 60°. According to the first preferred embodiment, however, the spurious emission is reduced more than in the first comparative example. It can also be understood that according to the first preferred embodiment, the impedance is low, and the element capacitance is high. As illustrated in FIG. 10, FIG. 11, and FIG. 12, the element capacitance can be increased, and the spurious emission can be reduced also in the case where the angle Θ2 is about 70°, in the case where the angle Θ2 is about 80°, and in the case where the angle Θ2 is about 90°. It is thus understood that the same or substantially the same result is obtained also in the cases other than the case where the angle Θ2 is about 50° described above. As for the second electrode film 27, for example, about 50°≤Θ2≤about 90° is preferably satisfied. In this case, the element capacitance can be increased with more certainty, and the spurious emission can be reduced with more certainty.

Another structure and a preferred structure according to the first preferred embodiment will now be described.

As illustrated in FIG. 2, the piezoelectric substrate 12 is a multilayer body including the support member 13 and the piezoelectric layer 16. The support substrate 14 of the support member 13 includes a recessed portion 14a and a support 14b. The support 14b surrounds the recessed portion 14a. The electrically insulating layer 15 is provided on the support 14b. The electrically insulating layer 15 has a frame shape. The electrically insulating layer 15 includes a through-hole 15a. The recessed portion 14a of the support substrate 14 and the through-hole 15a of the electrically insulating layer 15 define a recessed portion 13a of the support member 13. The piezoelectric layer 16 is provided so as to cover the recessed portion 13a of the support member 13. In other words, the piezoelectric layer 16 is provided so as to block the recessed portion 13a of the support member 13. Consequently, a cavity portion is provided. The cavity portion is surrounded by the recessed portion 13a of the support member 13 and the piezoelectric layer 16. The cavity portion may be provided without providing the recessed portion on the support member 13. For example, the cavity portion may be provided in a manner in which a recessed portion that opens toward the support member 13 is provided on the piezoelectric layer 16. The piezoelectric layer 16 includes a portion that is directly provided on the support member 13 and a portion that is provided above the support member 13 with the cavity portion interposed therebetween.

According to the present preferred embodiment, the electrically insulating layer 15 is, for example, a silicon oxide layer. More specifically, the electrically insulating layer 15 is, for example, a SiO$_2$ layer. However, the material of the electrically insulating layer 15 is not limited to the above description, and silicon nitride or tantalum oxide, for example, can be used. The electrically insulating layer 15 is not necessarily provided. The support member 13 may include the support substrate 14. In this case, the recessed portion 13a of the support member 13 is a recessed portion that is provided on only the support substrate 14. In the case where the electrically insulating layer 15 is provided, the recessed portion 13a may include a recessed portion or the through-hole that is provided on or in the electrically insulating layer 15, and it is not necessary for the support substrate 14 to include the recessed portion.

According to the present preferred embodiment, the support substrate 14 is, for example, a silicon substrate. However, the material of the support substrate 14 is not limited to the above description, and examples thereof can include piezoelectric materials such as aluminum oxide, lithium tantalate, lithium niobate, and quartz crystal, various kinds of ceramics such as alumina, sapphire, silicon nitride, aluminum nitride, silicon carbide, zirconia, cordierite, mullite, steatite, and forsterite, dielectrics such as diamond and glass, a semiconductor such as gallium nitride, and resin.

The support substrate 14 may include a through-hole. The cavity portion of the support member 13 may include the through-hole.

Figure 13:
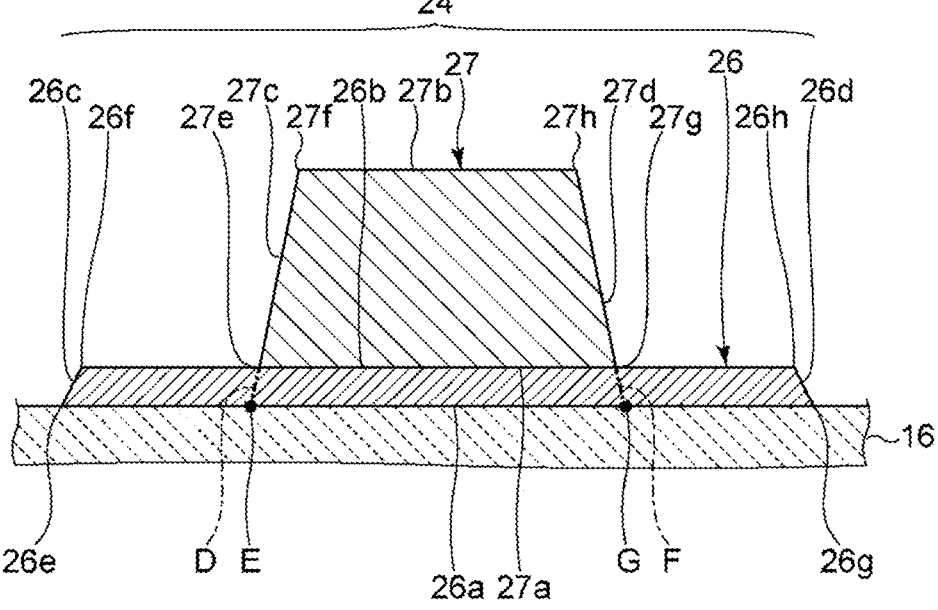
FIG. 13 is an elevational cross-sectional view illustrating the vicinity of a first electrode finger according to the first preferred embodiment of the present invention for describing a positional relationship between the first electrode film and the second electrode film.

FIG. 13 is an elevational cross-sectional view illustrating the vicinity of a first electrode finger according to the first preferred embodiment for describing a positional relationship between the first electrode film and the second electrode film.

The first side surface 26c of the first electrode film 26 includes a first edge portion 26e and a second edge portion 26f. Of the first edge portion 26e and the second edge portion 26f, the first edge portion 26e faces the piezoelectric layer 16. Similarly, the second side surface 26d includes a first edge portion 26g and a second edge portion 26h. The first side surface 27c of the second electrode film 27 includes a first edge portion 27e and a second edge portion 27f. Of the first edge portion 27e and the second edge portion 27f, the first edge portion 27e faces the piezoelectric layer 16. Similarly, the second side surface 27d includes a first edge portion 27g and a second edge portion 27h.

A position at which an extension line D from the first side surface 27c of the second electrode film 27 intersects with the first surface 26a of the first electrode film 26 is referred to as a position E. A position at which an extension line F from the second side surface 27d of the second electrode film 27 intersects with the first surface 26a of the first electrode film 26 is referred to as a position G. The first edge portions of the side surfaces of the first electrode film 26 are preferably located outside the position E and the position G in the width direction. More specifically, the first edge portion 26e of the first side surface 26c is preferably located outside the position E in the width direction. The first edge portion 26g of the second side surface 26d is preferably located outside the position G in the width direction. In this case, the element capacitance can be increased with more certainty.

The thickness of the first electrode film 26 is preferably less than the thickness of the second electrode film 27. This enables the spurious emission to be reduced with more certainty.

The first electrode film 26 preferably includes at least one of Ti, Ni, or Cr, for example. In this case, adhesion between the electrode fingers and the piezoelectric layer 16 can be improved. The second electrode film 27 preferably includes Al, for example. In this case, the electric resistance of the interdigital transducer electrode 11 can be reduced.

Figure 14:
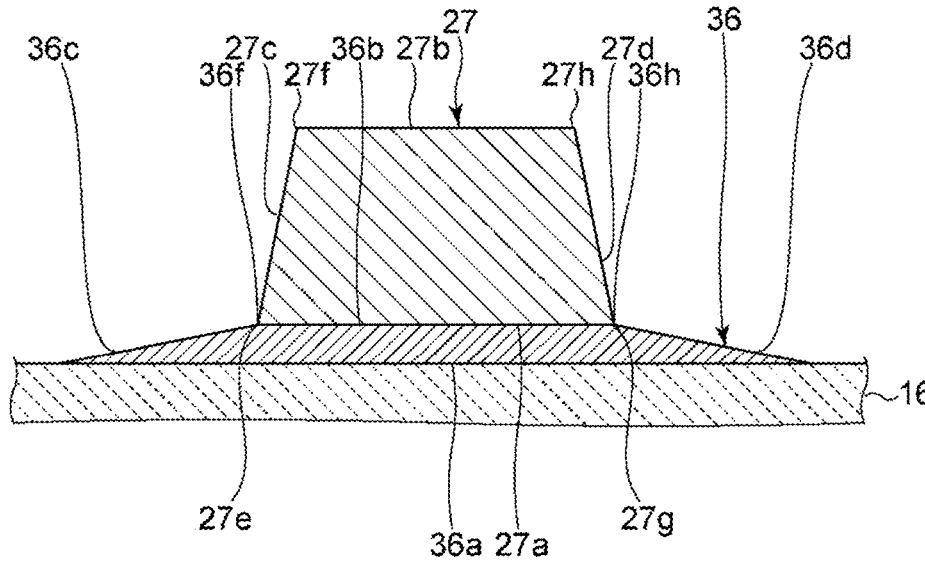
FIG. 14 is an elevational cross-sectional view illustrating the vicinity of a first electrode finger according to a modification to the first preferred embodiment of the present invention.

According to the first preferred embodiment, the width of the second surface 26b of the first electrode film 26 is greater than the width of the first surface 27a of the second electrode film 27. However, this is not a limitation. According to a modification to the first preferred embodiment illustrated in FIG. 14, the width of a second surface 36b of a first electrode film 36 is equal or substantially equal to the width of the first surface 27a of the second electrode film 27. A second edge portion 36f of a first side surface 36c of the first electrode film 36 is in contact with the first edge portion 27e of the first side surface 27c of the second electrode film 27. Similarly, a second edge portion 36h of a second side surface 36d of the first electrode film 36 is in contact with the first edge portion 27g of the second side surface 27d of the second electrode film 27. The width of a first surface 36a of the first electrode film 36 is greater than the width of the first surface 27a of the second electrode film 27 as in the first preferred embodiment. Also, in this case, the element capacitance can be increased, and the spurious emission can be reduced.

According to the first preferred embodiment, the second electrode film 27 is directly provided on the first electrode film 26. However, the second electrode film may be provided indirectly above the first electrode film 26 with another electrode film interposed therebetween. An example thereof will now be described.

Figure 15:
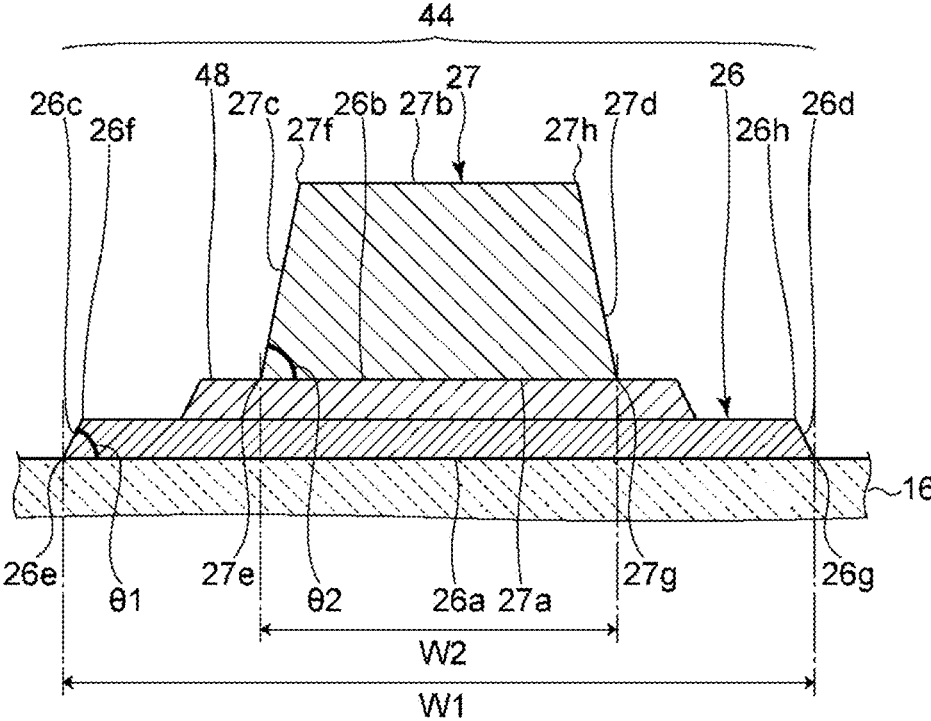
FIG. 15 is an elevational cross-sectional view illustrating the vicinity of a first electrode finger according to a second preferred embodiment of the present invention.

FIG. 15 is an elevational cross-sectional view illustrating the vicinity of a first electrode finger according to a second preferred embodiment of the present invention.

The present preferred embodiment differs from the first preferred embodiment in that multiple first electrode fingers 44 and multiple second electrode fingers include respective third electrode films 48. The third electrode films 48 are provided between the first electrode films 26 and the second electrode films 27. An acoustic wave device according to the second preferred embodiment has the same or substantially the same structure as that of the acoustic wave device 10 according to the first preferred embodiment, except for the matter described above.

The width of each third electrode film 48 is less than the width W1 of each first electrode film 26 and greater than the width W2 of each second electrode film 27. Also, according to the present preferred embodiment, $\Theta 1 \neq \Theta 2$ is satisfied, and W1>W2 is satisfied. This enables the element capacitance to be increased and enables the spurious emission to be reduced as in the first preferred embodiment. Multiple electrode films may be provided between the first electrode film 26 and the second electrode film 27.

Figure 16:
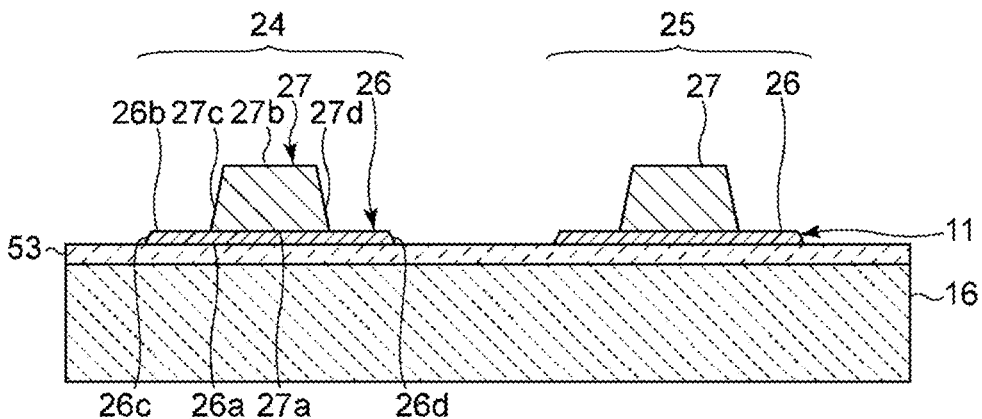
FIG. 16 is an elevational cross-sectional view illustrating the vicinity of a pair of electrode fingers according to a third preferred embodiment of the present invention.

FIG. 16 is an elevational cross-sectional view illustrating the vicinity of a pair of electrode fingers according to a third preferred embodiment of the present invention.

The present preferred embodiment differs from the first preferred embodiment in that a dielectric film 53 is provided between the interdigital transducer electrode 11 and the piezoelectric layer 16. Specifically, the dielectric film 53 is provided between each first electrode film 26 and the piezoelectric layer 16. An acoustic wave device according to the present preferred embodiment has the same or substantially the same structure as that of the acoustic wave device 10 according to the first preferred embodiment except for the matter described above.

The dielectric film 53 is provided between the interdigital transducer electrode 11 and the piezoelectric layer 16, and consequently, the fractional band width can be readily adjusted. Examples of the material of the dielectric film 53 can include silicon oxide, silicon nitride, and resin. Also, according to the present preferred embodiment, $\Theta 1 \neq \Theta 2$ is satisfied, and W1>W2 is satisfied as in the first preferred embodiment. This enables the element capacitance to be increased and enables the spurious emission to be reduced.

An acoustic wave device according to a preferred embodiment of the present invention may be used for a filter device. An example thereof will now be described.

Figure 17:
FIG. 17 is a circuit diagram of a filter device according to a fourth preferred embodiment of the present invention.
Figure 17:
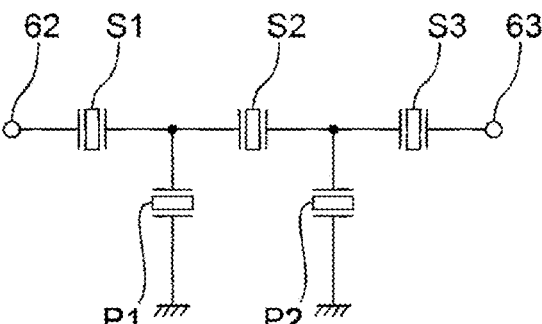

FIG. 17 is a circuit diagram of a filter device according to a fourth preferred embodiment of the present invention.

A filter device 60 is, for example, a ladder filter. The filter device 60 includes a series arm resonator S1, a series arm resonator S2, a series arm resonator S3, a parallel arm resonator P1, and a parallel arm resonator P2 that serve as multiple acoustic wave devices. The filter device 60 also includes a first signal terminal 62 and a second signal terminal 63. An example of the first signal terminal 62 may be an antenna terminal. The antenna terminal is connected to an antenna. The first signal terminal 62 and the second signal terminal 63 may define and function as electrode pads or may define and function as wiring lines.

The series arm resonator S1, the series arm resonator S2, and the series arm resonator S3 are connected to each other in series between the first signal terminal 62 and the second signal terminal 63. The parallel arm resonator P1 is connected to a connection point between the series arm resonator S1 and the series arm resonator S2 and a ground potential. The parallel arm resonator P2 is connected to a connection point between the series arm resonator S2 and the series arm resonator S3 and the ground potential. However, the circuit structure of the filter device 60 is not limited to the above description. For example, the filter device 60 includes at least a single series arm resonator and at least a single parallel arm resonator. It is not necessary for the filter device 60 to be the ladder filter.

According to the present preferred embodiment, each of the multiple acoustic wave resonators is an acoustic wave device according to a preferred embodiment of the present invention. This enables the element capacitance of each acoustic wave resonator of the filter device 60 to be increased and enables the spurious emission to be reduced.

The angle Θ2 of the second electrode film preferably differs between at least two acoustic wave resonators of the filter device 60. This enables the frequency of a ripple that occurs in each acoustic wave resonator to be adjusted. This enables the frequency of the ripple that occurs in the filter device 60 to be out of the pass band of another filter device in the case where the filter device 60 is used for a duplexer or a multiplexer, for example. Accordingly, the filter characteristic of, for example, the duplexer or the multiplexer can be prevented from being degraded.

A ratio W1/W2 between the width W1 of the first electrode film and the width W2 of the second electrode film preferably differs between at least two acoustic wave resonators of the filter device 60. This enables the element capacitance of each acoustic wave resonator to be readily adjusted.

The thickness-shear mode will now be described in detail. A support member in an example described below corresponds to a support substrate according to a preferred embodiment of the present invention.

Figure 18A:
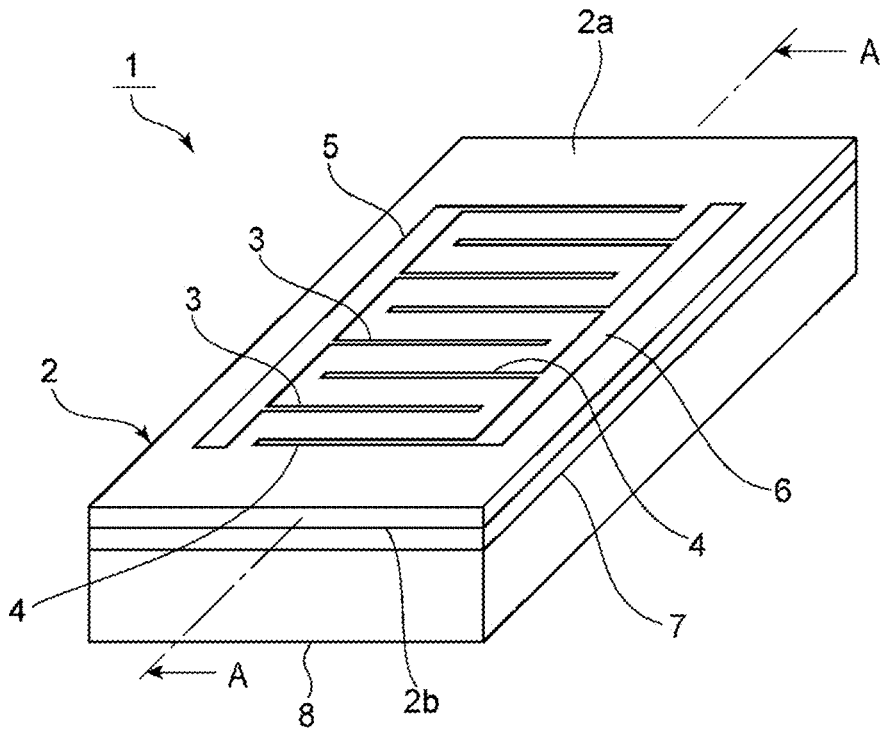
FIG. 18A is a schematic perspective view illustrating the appearance of an acoustic wave device that uses a bulk wave in a thickness-shear mode.
Figure 18B:
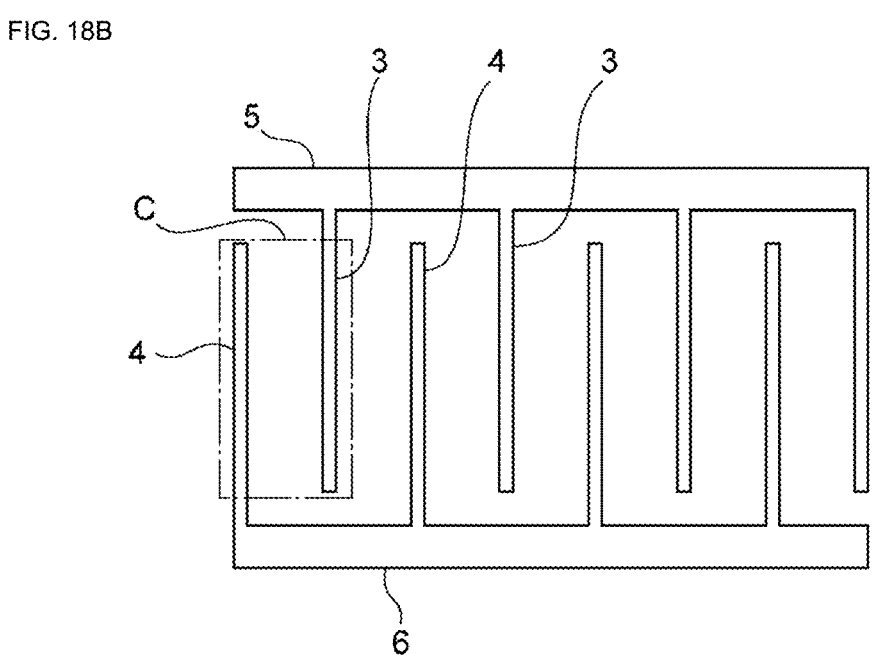
FIG. 18B is a plan view illustrating an electrode structure on a piezoelectric layer.
Figure 19:
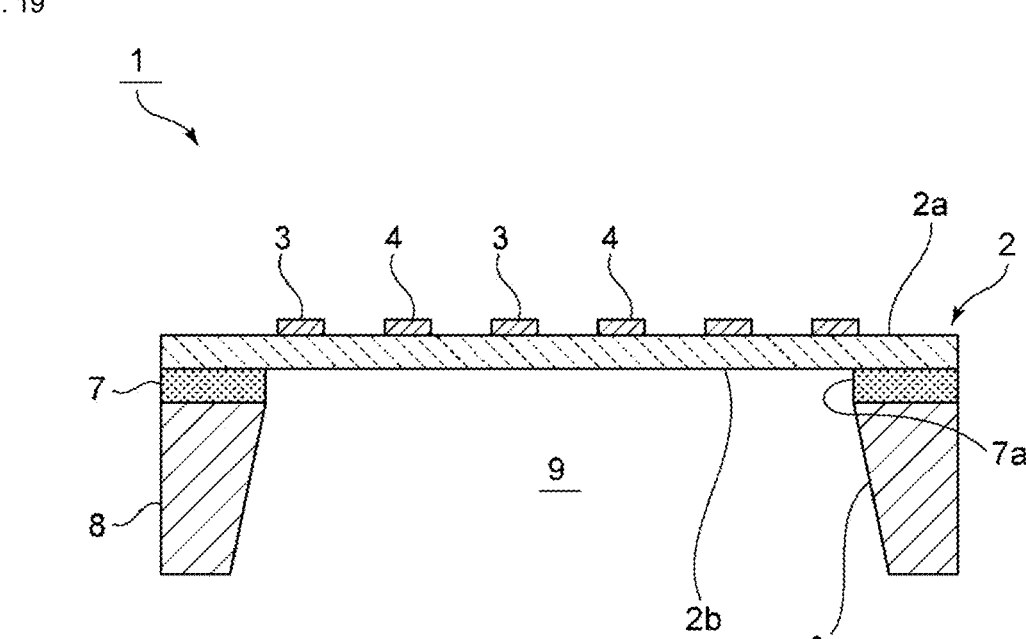
FIG. 19 is a sectional view of a portion in FIG. 18A taken along line A-A.

FIG. 18A is a schematic perspective view illustrating the appearance of an acoustic wave device that uses a bulk wave in the thickness-shear mode. FIG. 18B is a plan view illustrating an electrode structure on a piezoelectric layer. FIG. 19 is a sectional view of a portion in FIG. 18A taken along line A-A.

An acoustic wave device 1 includes a piezoelectric layer 2 made of, for example, LiNbO$_3$. The piezoelectric layer 2 may be made of, for example, LiTaO$_3$. As for the cut-angles of LiNbO$_3$ and LiTaO$_3$, Z-cut is used, but rotated Y-cut or X-cut may be used. The thickness of the piezoelectric layer 2 is not particularly limited but is, for example, preferably no less than about 40 nm and no more than about 1000 nm and is more preferably no less than about 50 nm and no more than about 1000 nm to effectively excite the thickness-shear mode. The piezoelectric layer 2 includes first and second main surfaces 2a and 2b facing away from each other. Electrodes 3 and electrodes 4 are provided on the first main surface 2a. The electrodes 3 are examples of a "first electrode", and the electrodes 4 are examples of a "second electrode". In FIGS. 18A and 18B, the multiple electrodes 3 are connected to a first busbar 5. The multiple electrodes 4 are connected to a second busbar 6. The multiple electrodes 3 and the multiple electrodes 4 are interdigitated with each other. The electrodes 3 and the electrodes 4 have a rectangular or substantially rectangular shape and have a length direction. The electrodes 3 and adjacent electrodes 4 face each other in a direction perpendicular or substantially perpendicular to the length direction. The length direction of the electrodes 3 and 4 and the direction perpendicular or substantially perpendicular to the length direction of the electrodes 3 and 4 both are directions that intersect with the thickness direction of the piezoelectric layer 2. For this reason, it can be said that the electrodes 3 and the adjacent electrodes 4 face each other in the direction that intersects with the thickness direction of the piezoelectric layer 2. Alternatively, the length direction of the electrodes 3 and 4 may be interchanged with the direction perpendicular or substantially perpendicular to the length direction of the electrodes 3 and 4 illustrated in FIGS. 18A and 18B. That is, in FIGS. 18A and 18B, the electrodes 3 and 4 may extend in a direction in which the first busbar 5 and the second busbar 6 extend. In this case, the first busbar 5 and the second busbar 6 extend in the direction in which the electrodes 3 and 4 extend in FIGS. 18A and 18B. Multiple paired structures in which the electrodes 3 connected to one potential and the electrodes 4 connected to the other potential are adjacent to each other are arranged in the direction perpendicular or substantially perpendicular to the length direction of the electrodes 3 and 4 described above. The case where the electrodes 3 and the electrodes 4 are adjacent to each other, described herein, does not mean the case where the electrodes 3 and the electrodes 4 are in direct contact with each other, but means the case where the electrodes 3 and the electrodes 4 are disposed with gaps interposed therebetween. When one of the electrodes 3 and one of the electrodes 4 are adjacent to each other, an electrode that is connected to a hot electrode or a ground electrode, including the other electrodes 3 and 4, is not disposed between the electrode 3 and the electrode 4. The number of pairs thereof is not necessarily an integer number of pairs but may be, for example, 1.5 pairs or 2.5 pairs. A distance between the centers of the electrodes 3 and 4, that is, a pitch preferably falls within the range of, for example, no less than about 1 μm and no more than about 10 μm. The width of each of the electrodes 3 and 4, that is, the dimension of each of the electrodes 3 and 4 in a direction in which the electrodes 3 and 4 face each other preferably falls within the range of, for example, no less than about 50 nm and no more than about 1000 nm and more preferably falls within the range of, for example, no less than about 150 nm and no more than about 1000 nm. The distance between the centers of the electrodes 3 and 4 is a distance between the center of the dimension (width dimension) of the electrode 3 in the direction perpendicular or substantially perpendicular to the length direction of the electrode 3 and the center of the dimension (width dimension) of the electrode 4 in the direction perpendicular or substantially perpendicular to the length direction of the electrode 4.

As for the acoustic wave device 1, a piezoelectric layer of Z-cut is used, and accordingly, the direction perpendicular or substantially perpendicular to the length direction of the electrodes 3 and 4 is a direction perpendicular or substantially perpendicular to a polarization direction of the piezoelectric layer 2. When a piezoelectric material that has another cut-angle is used as the piezoelectric layer 2, this is not the case. The meaning of "perpendicular" described herein is not limited only to the case of being strictly perpendicular but may be the meaning of substantially perpendicular (an angle formed between the direction perpendicular to the length direction of the electrodes 3 and 4 and the polarization direction falls within, for example, about 90°±10°).

A support member 8 is stacked along the second main surface 2b of the piezoelectric layer 2 with an electrically insulating layer 7 interposed therebetween. As illustrated in FIG. 19, the electrically insulating layer 7 has a frame shape and includes a through-hole 7a, and the support member 8 has a frame shape and includes a through-hole 8a. Consequently, a cavity portion, that is, an air gap 9 is provided. The air gap 9 is provided so as to overlap the electrodes 3 and 4 in a plan view. In the present specification, the plan view indicates a direction in which FIG. 1 is viewed from above. The support member 8 may include a recessed portion instead of the through-hole 8a. The piezoelectric layer 2 faces the air gap 9. The air gap 9 is provided so as not to prevent an excitation region C of the piezoelectric layer 2 from vibrating. Accordingly, the support member 8 described above is stacked along the second main surface 2b with the electrically insulating layer 7 interposed therebetween at a location at which the support member 8 does not overlap a portion where at least one pair of electrodes 3 and 4 is provided. It is not necessary to provide the electrically insulating layer 7. Accordingly, the support member 8 can be stacked directly on or indirectly along the second main surface 2b of the piezoelectric layer 2.

The electrically insulating layer 7 is made of, for example, silicon oxide. Other than silicon oxide, however, an appropriate electrically insulating material such as, for example, silicon oxynitride or alumina may be used. The support member 8 is made of, for example, Si. A plane direction of a Si surface that faces the piezoelectric layer 2 may be (100) or (110) or may be (111). Si of which the support member 8 is made preferably has a resistivity of, for example, about 4 kΩ or higher. However, the support member 8 can be made of an appropriate electrically insulating material or a semiconductor material.

Examples of the material of the support member 8 include piezoelectric materials such as aluminum oxide, lithium tantalate, lithium niobate, and quartz crystal, various kinds of ceramics such as alumina, magnesia, sapphire, silicon nitride, aluminum nitride, silicon carbide, zirconia, cordierite, mullite, steatite, and forsterite, dielectrics such as diamond and glass, and a semiconductor such as gallium nitride.

The multiple electrodes 3 and 4 and the first and second busbars 5 and 6 described above are made of an appropriate metal or alloy such as, for example, Al or an AlCu alloy. According to the present preferred embodiment, the electrodes 3 and 4 and the first and second busbars 5 and 6 have a structure in which an Al film is stacked on a Ti film. A close-contact layer other than a Ti film may be used.

At the time of driving, an alternating voltage is applied across the multiple electrodes 3 and the multiple electrodes 4. More specifically, an alternating voltage is applied across the first busbar 5 and the second busbar 6. Consequently, resonant characteristics can be obtained by using a bulk wave in the thickness-shear mode that is excited in the piezoelectric layer 2. As for the acoustic wave device 1, d/p is, for example, about 0.5 or less where d is the thickness of the piezoelectric layer 2, and p is the distance between the centers of any adjacent electrodes 3 and 4 of multiple pairs of the electrodes 3 and 4. For this reason, the bulk wave in the thickness-shear mode described above is effectively excited, and good resonant characteristics can be obtained. More preferably, d/p is, for example, about 0.24 or less. In this case, better resonant characteristics can be obtained.

The acoustic wave device 1 has the structure described above and is unlikely to decrease a Q value even in the case where the number of pairs of the electrodes 3 and 4 is reduced to reduce the size. The reason is that a propagation loss is small even in the case where the number of the electrode fingers of reflectors on both sides is reduced. The reason why the number of the electrode fingers described above can be reduced is because the bulk wave in the thickness-shear mode is used. The difference between a Lamb wave used in the acoustic wave device and the bulk wave in the thickness-shear mode described above will be described with reference to FIGS. 20A and 20B.

Figure 20A:
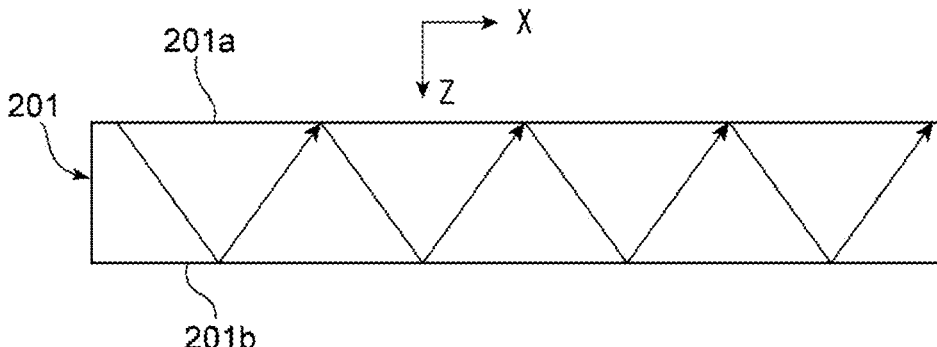
FIG. 20A is a schematic elevational cross-sectional view for describing a lamb wave propagating in a piezoelectric film of an acoustic wave device.

FIG. 20A is a schematic elevational cross-sectional view for illustrating a Lamb wave propagating in a piezoelectric film of an acoustic wave device as described in U.S. Pat. No. 10,491,192. Here, the wave propagates in a piezoelectric film 201 as illustrated by arrows. As for the piezoelectric film 201, a first main surface 201a and a second main surface 201b face away from each other. A thickness direction in which the first main surface 201a and the second main surface 201b are connected is a Z-direction. An X-direction is a direction in which electrode fingers of an interdigital transducer electrode are arranged. As illustrated in FIG. 20A, for a Lamb wave, the wave propagates in the X-direction as illustrated in the figure. The wave is a plate wave, and the piezoelectric film 201 vibrates as a whole. Since the wave propagates in the X-direction, however, resonant characteristics are obtained by disposing reflectors on both sides. For this reason, a wave propagation loss occurs, and the Q value decreases in the case where the size is reduced, that is, in the case where the number of pairs of the electrode fingers is reduced.

Figure 20B:
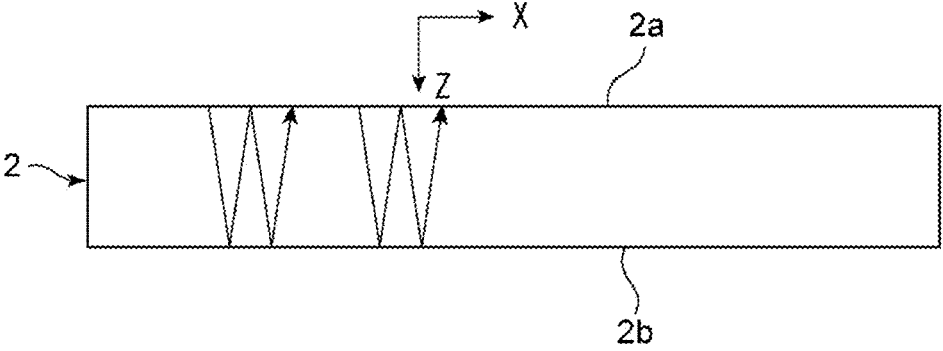
FIG. 20B is a schematic elevational cross-sectional view for describing the bulk wave in the thickness-shear mode propagating in the piezoelectric film of the acoustic wave device.

As for the acoustic wave device 1, as illustrated in FIG. 20B, a vibration displacement is caused in a thickness-shear direction, a wave propagates substantially in the direction in which the first main surface 2a and the second main surface 2b of the piezoelectric layer 2 are connected, that is, the Z-direction, and resonance occurs. That is, a component of the wave in the X-direction is significantly smaller than a component in the Z-direction. The resonant characteristics are obtained from the propagation of the wave in the Z-direction, and accordingly, a propagation loss is unlikely to occur even in the case where the number of the electrode fingers of the reflectors is reduced. The Q value is unlikely to decrease even in the case where the number of pairs of electrode pairs including the electrodes 3 and 4 is reduced to reduce the size.

Figure 21:
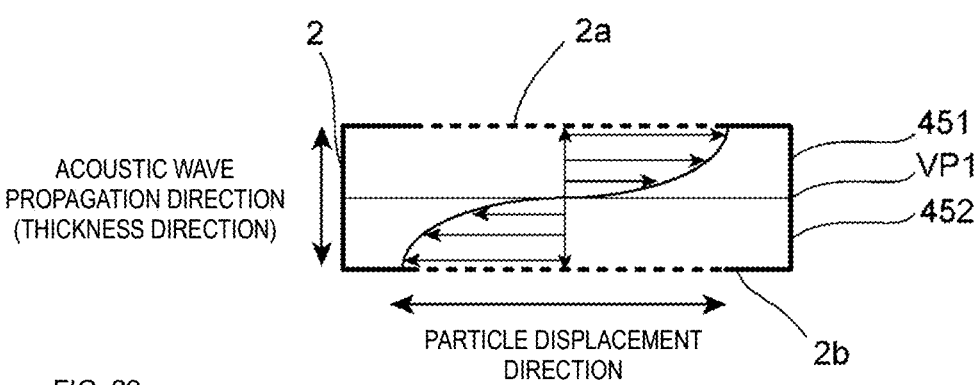
FIG. 21 illustrates an amplitude direction of the bulk wave in the thickness-shear mode.

As illustrated in FIG. 21, the amplitude direction of a bulk wave in the thickness-shear mode in a first region 451 that is included in the excitation region C of the piezoelectric layer 2 is opposite that in a second region 452 that is included in the excitation region C. FIG. 21 schematically illustrates a bulk wave in the case where a voltage is applied across the electrodes 3 and the electrodes 4 such that the electrodes 4 have a potential higher than that of the electrodes 3. The first region 451 is a region in the excitation region C between the first main surface 2a and a virtual plane VP1 that is perpendicular to the thickness direction of the piezoelectric layer 2 and that divides the piezoelectric layer 2 into two. The second region 452 is a region in the excitation region C between the virtual plane VP1 and the second main surface 2b.

The acoustic wave device 1 includes at least one electrode pair including the electrode 3 and the electrode 4 as described above, but does not intend to cause the wave to propagate in the X-direction, and the number of pairs of the electrode pairs consisting of the electrodes 3 and 4 is not necessarily more than one. That is, at least one electrode pair is sufficient.

For example, the electrodes 3 described above are electrodes that are connected to a hot potential, and the electrodes 4 are electrodes that are connected to the ground potential. However, the electrodes 3 may be connected to the ground potential, and the electrodes 4 may be connected to the hot potential. According to the present preferred embodiment, an electrode of at least one electrode pair is an electrode that is connected to the hot potential or an electrode that is connected to the ground potential as described above, and no floating electrode is provided.

Figure 22:
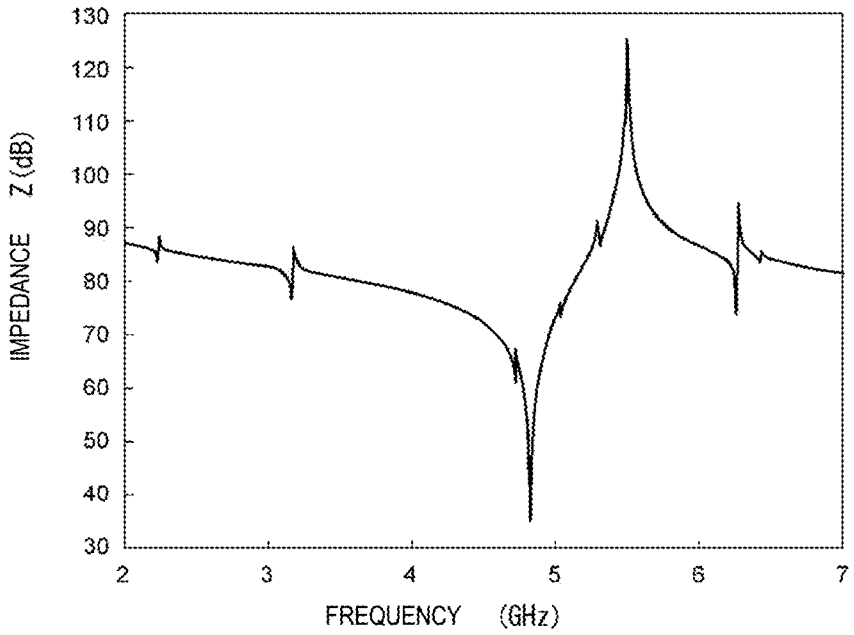
FIG. 22 illustrates resonant characteristics of the acoustic wave device that uses the bulk wave in the thickness-shear mode.

FIG. 22 is a graph illustrating the resonant characteristics of the acoustic wave device illustrated in FIG. 19. The design parameters of the acoustic wave device 1 that obtains the resonant characteristics are as follows.

Piezoelectric layer 2: $LiNbO_3$ the Euler angles of which are (0°, 0°, 90°), thickness=about 400 nm.

When viewed in the direction perpendicular or substantially perpendicular to the length direction of the electrodes 3 and the electrodes 4, the length of a region in which electrodes 3 and the electrodes 4 overlap, that is, the excitation region C is, for example, about 40 μm, the number of the pairs of the electrodes consisting of the electrodes 3 and 4 is, for example, 21 pairs, the distance between the centers of the electrodes is, for example, about 3 μm, the width of each of the electrodes 3 and 4 is, for example about 500 nm, and d/p is, for example, about 0.133.

Electrically insulating layer 7: a silicon oxide film having a thickness of about 1 μm.

Support member 8: Si.

The length of the excitation region C is the dimension of the excitation region C in the length direction of the electrodes 3 and 4.

According to the present preferred embodiment, as for all of the multiple pairs, the distance between the electrodes of the electrode pairs including the electrodes 3 and 4 has the same or substantially the same value. That is, the electrodes 3 and the electrodes 4 are disposed at the same or substantially the same pitch.

As is apparent from FIG. 22, good resonant characteristics that exhibit a fractional band width of about 12.5% are obtained although no reflectors are provided.

According to the present preferred embodiment, for example, d/p is about 0.5 or less and preferably about 0.24 or less where d is the thickness of the piezoelectric layer 2 described above, and p is the distance between the centers of the electrodes of the electrodes 3 and the electrodes 4 as described above. This will be described with reference to FIG. 23.

Figure 23:
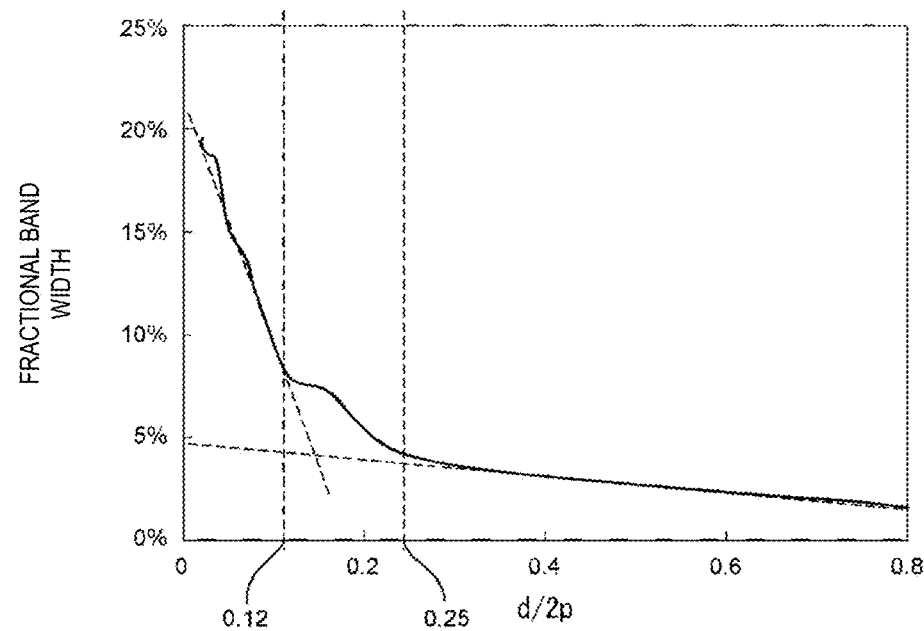
FIG. 23 illustrates the relationship between d/2p and a fractional band width when the acoustic wave device used as a resonator where p is a distance between the centers of adjacent electrodes, and d is the thickness of the piezoelectric layer.

Multiple acoustic wave devices are obtained in the same manner as the acoustic wave device that obtains the resonant characteristics illustrated in FIG. 22 except that d/2p is changed. FIG. 23 is a graph illustrating the relationship between d/2p and the fractional band width of each acoustic wave device that defines and functions as a resonator.

As is apparent from FIG. 23, when d/2p exceeds about 0.25, that is, when d/p>about 0.5 is satisfied, the fractional band width is less than about 5% regardless of adjustment of d/p. In contrast, when d/2p≤about 0.25 is satisfied, that is, when d/p≤about 0.5 is satisfied, the fractional band width can be about 5% or more, that is, a resonator having a high coupling coefficient can be provided by changing d/p within the range. When d/2p is about 0.12 or less, that is, when d/p is about 0.24 or less, the fractional band width can be increased to about 7% or more. In addition, a resonator having a greater fractional band width can be obtained, and a resonator having a higher coupling coefficient can be obtained by adjusting d/p within the range. Accordingly, it is understood that a resonator that uses a bulk wave in the thickness-shear mode described above and that has a high coupling coefficient can be provided by setting d/p to about 0.5 or less.

Figure 24:
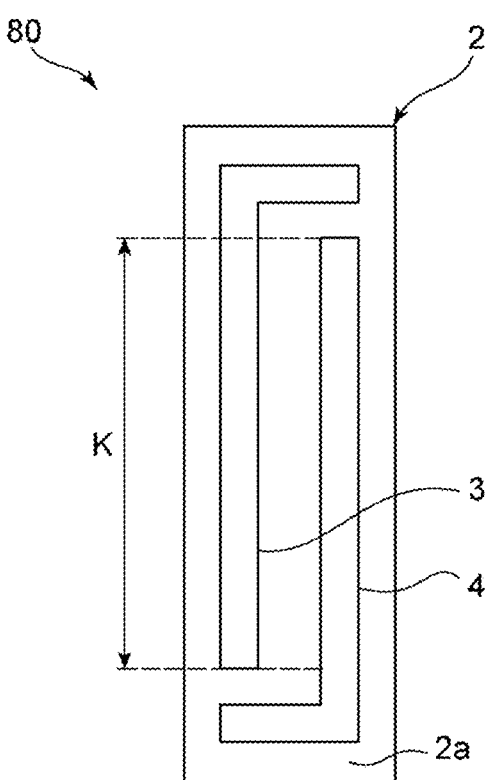
FIG. 24 is a plan view of an acoustic wave device that uses a bulk wave in the thickness-shear mode.

FIG. 24 is a plan view of an acoustic wave device that uses a bulk wave in the thickness-shear mode. As for an acoustic wave device 80, one electrode pair including the electrode 3 and the electrode 4 is provided on the first main surface 2a of the piezoelectric layer 2. In FIG. 24, K is an intersecting width. As for an acoustic wave device according to a preferred embodiment of the present invention, the number of pairs of the electrodes may be one as described above. Also, in this case, when d/p described above is, for example, about 0.5 or less, the bulk wave in the thickness-shear mode can be effectively excited.

Figure 25:
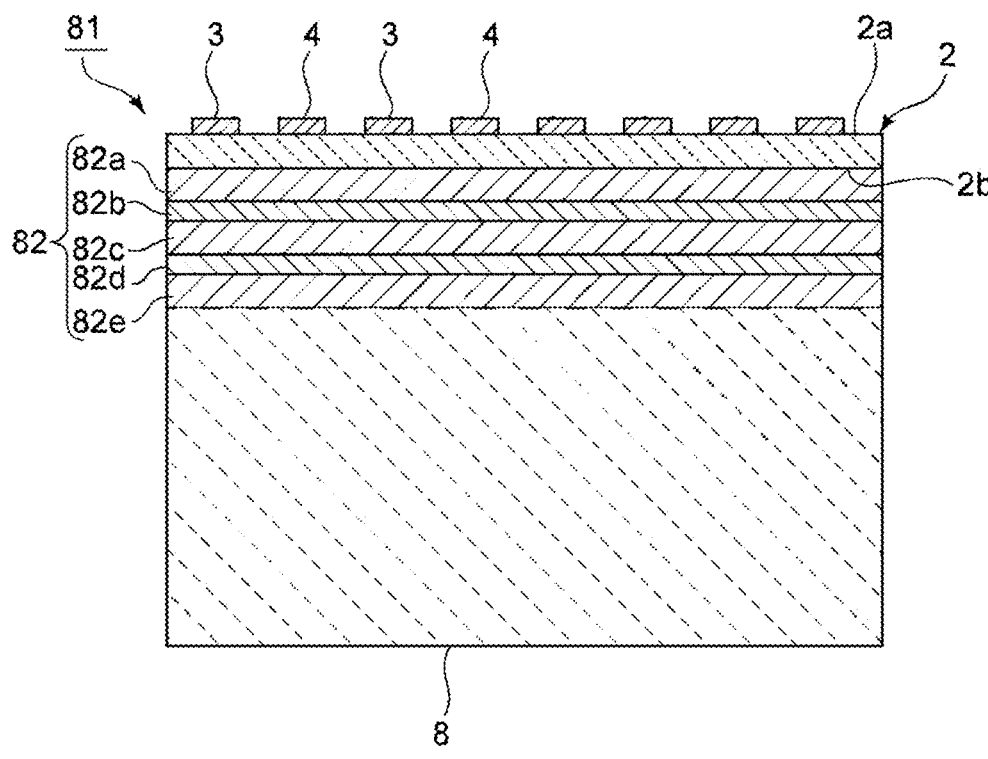
FIG. 25 is an elevational cross-sectional view of an acoustic wave device that includes an acoustic multilayer film.

FIG. 25 is an elevational cross-sectional view of an acoustic wave device that includes an acoustic multilayer film. An acoustic wave device 81 includes an acoustic multilayer film 82 that is stacked on the second main surface 2b of the piezoelectric layer 2. The acoustic multilayer film 82 has a multilayer structure including low-acoustic-impedance layers 82a, 82c, and 82e that have a relatively low acoustic impedance and high-acoustic-impedance layers 82b and 82d that have a relatively high acoustic impedance. In the case where the acoustic multilayer film 82 is used, a bulk wave in the thickness-shear mode can be confined within the piezoelectric layer 2 without using the air gap 9 in the acoustic wave device 1. Also, as for the acoustic wave device 81, the resonant characteristics based on the bulk wave in the thickness-shear mode can be obtained by setting d/p described above to about 0.5 or less, for example. As for the acoustic multilayer film 82, the number of the low-acoustic-impedance layers 82a, 82c, and 82e and the high-acoustic-impedance layers 82b and 82d that are stacked is not particularly limited, provided that at least one of the high-acoustic-impedance layers 82b and 82d is farther than the low-acoustic-impedance layer 82a, 82c, or 82e from the piezoelectric layer 2.

The low-acoustic-impedance layers 82a, 82c, and 82e and the high-acoustic-impedance layers 82b and 82d described above can be made of an appropriate material, provided that the relationship in the acoustic impedance described above is satisfied. Examples of the materials of the low-acoustic-impedance layers 82a, 82c, and 82e can include silicon oxide, a polymer, and light metal such as aluminum. Examples of the materials of the high-acoustic-impedance layers 82b and 82d can include alumina, silicon nitride, tantalum oxide, and heavy metal such as tungsten. In the case of the device that uses the interdigital transducer electrode, however, an acoustic multilayer film that includes a dielectric film is preferably used because no stray capacitance occurs.

Figure 26:
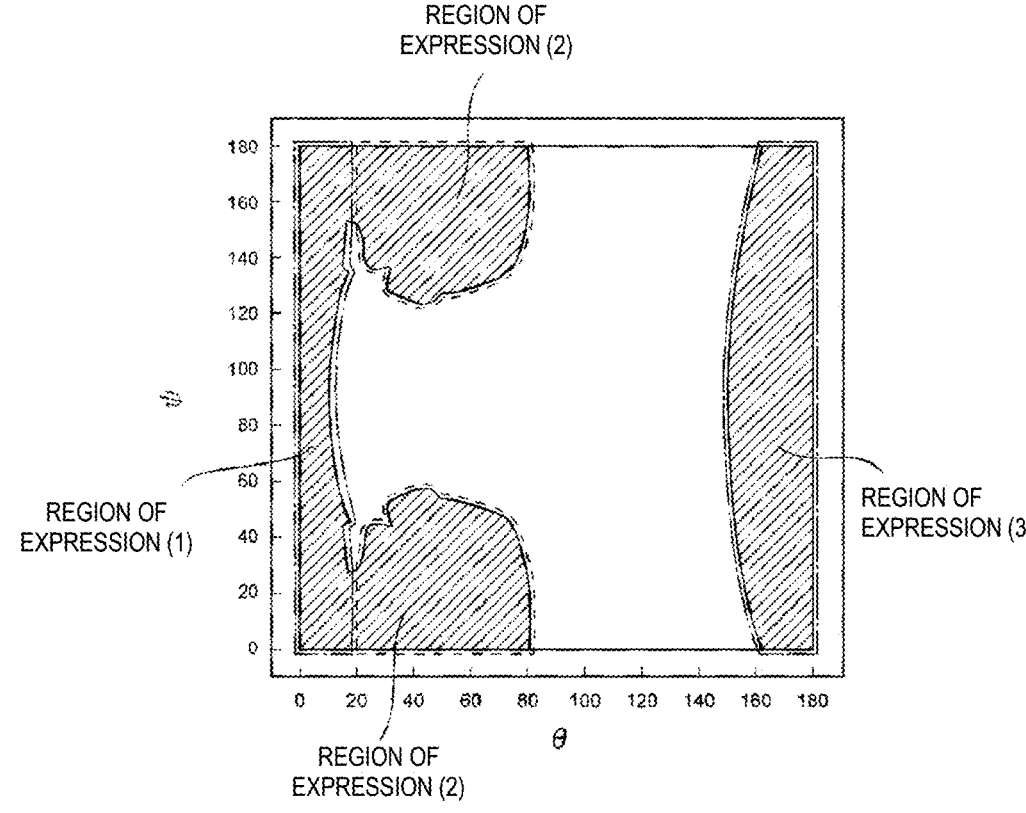
FIG. 26 is a map of the fractional band width with respect to the Euler angles (0°, $\Theta$, $\Psi$) of LiNbO$_3$ when d/p is close to zero as much as possible.

FIG. 26 is a diagram illustrating a map of the fractional band width with respect to the Euler angles (0°, Θ, Ψ) of $LiNbO_3$ when d/p is close to zero as much as possible. Hatched portions in FIG. 26 correspond to regions in which at least a fractional band width of about 5% or more is obtained. The approximation of the ranges of the regions results in ranges that are expressed as the following expression (1), expression (2), and expression (3).

$$(0°\pm10°,0° \text{ to } 20°,\text{freely selected } \Psi) \qquad \text{expression (1)}$$

$$(0°\pm10°,20° \text{ to } 80°,0° \text{ to } 60°(1-(\Theta-50)^2/900)^{1/2}) \text{ or}$$
$$(0°\pm10°,20° \text{ to } 80°,[180°-60°(1-(\Theta-50)^2/900)^{1/2}] \text{ to } 180°) \qquad \text{expression (2)}$$

$$(0°\pm10°,[180°-30°(1-(\Psi-90)^2/8100)^{1/2}] \text{ to } 180°,$$
$$\text{freely selected } \Psi) \qquad \text{expression (3)}$$

Accordingly, in the case of the ranges of the Euler angles expressed as the expression (1), the expression (2), or the expression (3) described above, the fractional band width can be sufficiently increased, which is preferable. The same is true for the case where the piezoelectric layer 2 is a lithium tantalate layer.

An acoustic wave device according to a preferred embodiment of the present invention may include the acoustic multilayer film 82 illustrated in FIG. 25. For example, the acoustic multilayer film 82 may be provided between the support member 13 and the piezoelectric layer 16 according to the first preferred embodiment illustrated in FIG. 2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a plurality of acoustic wave resonators; wherein
the plurality of acoustic wave resonators include all acoustic wave resonators included in the filter device;
each of the plurality of acoustic wave resonators is an acoustic wave device including:
a piezoelectric layer including a first main surface and a second main surface facing away from each other and made of lithium niobate or lithium tantalate; and
an interdigital transducer electrode on the first main surface of the piezoelectric layer and including a plurality of electrode fingers;
in each of the acoustic wave devices of the plurality of acoustic wave resonators:
d/p is about 0.5 or less, where d is a thickness of the piezoelectric layer, and p is a distance between centers of adjacent electrode fingers of the plurality of electrode fingers;
the plurality of electrode fingers include a first electrode film and a second electrode film on the first electrode film;
the first electrode film and the second electrode film each include a first surface and a second surface facing away from each other in a thickness direction and a side surface connected to the first surface and the second surface;
$\Theta1+\Theta2$ is satisfied and W1>W2 is satisfied, where $\Theta1$ is an angle between the side surface and the first surface of the first electrode film, $\Theta2$ is an angle between the side surface and the first surface of the second electrode film, W1 is a width of the first electrode film, and W2 is a width of the second electrode film; and
a ratio W1/W2 between the width W1 of the first electrode film and the width W2 of the second electrode film differs between at least two of the plurality of acoustic wave resonators.

<span>18</span>

2. The filter device according to claim 1, wherein a thickness of the first electrode film is less than a thickness of the second electrode film.

3. The filter device according to claim 1, wherein about $50°\leq\Theta2\leq$ about 90° is satisfied.

4. The filter device according to claim 1, wherein the first electrode film includes at least one of Ti, Ni, or Cr.

5. The filter device according to claim 1, wherein the second electrode film includes Al.

6. The filter device according to claim 1, further comprising a dielectric film between the first electrode film and the piezoelectric layer.

7. The filter device according to claim 1, wherein Euler angles ($\phi$, $\Theta$, $\Psi$) of the lithium niobate or the lithium tantalate of which the piezoelectric layer is made fall within a range of expression (1), expression (2), or expression (3):

$$(0°\pm10°,0° \text{ to } 20°,\text{freely selected } \Psi) \qquad \text{expression (1);}$$

$$(0°\pm10°,20° \text{ to } 80°,0° \text{ to } 60°(1-(\Theta-50)^2/900)^{1/2}) \text{ or}$$
$$(0°\pm10°,20° \text{ to } 80°,[180°-60°(1-(\Theta-50)^2/900)^{1/2}] \text{ to } 180°) \qquad \text{expression (2); and}$$

$$(0°\pm10°,[180°-30°(1-(\Psi-90)^2/8100)^{1/2}] \text{ to } 180°,$$
$$\text{freely selected } \Psi) \qquad \text{expression (3).}$$

8. A filter device comprising:
a plurality of acoustic wave resonators; wherein
the plurality of acoustic wave resonators include all acoustic wave resonators included in the filter device;
each of the plurality of acoustic wave resonators is an acoustic wave device including:
a piezoelectric layer including a first main surface and a second main surface facing away from each other and made of lithium niobate or lithium tantalate; and
an interdigital transducer electrode on the first main surface of the piezoelectric layer and including a plurality of electrode fingers; and
in each of the acoustic wave devices of the plurality of acoustic wave resonators:
d/p is about 0.5 or less, where d is a thickness of the piezoelectric layer, and p is a distance between centers of adjacent electrode fingers of the plurality of electrode fingers;
the plurality of electrode fingers include a first electrode film and a second electrode film on the first electrode film;
the first electrode film and the second electrode film each include a first surface and a second surface facing away from each other in a thickness direction and a side surface connected to the first surface and the second surface;
$\Theta1\neq\Theta2$ is satisfied and W1>W2 is satisfied, where $\Theta1$ is an angle between the side surface and the first surface of the first electrode film, $\Theta2$ is an angle between the side surface and the first surface of the second electrode film, W1 is a width of the first electrode film, and W2 is a width of the second electrode film; and
the angle $\Theta2$ differs between at least two of the plurality of acoustic wave resonators.

9. The filter device according to claim 8, wherein a thickness of the first electrode film is less than a thickness of the second electrode film.

10. The filter device according to claim 8, wherein about $50°\leq\Theta2\leq$ about 90° is satisfied.

11. The filter device according to claim 8, wherein the first electrode film includes at least one of Ti, Ni, or Cr.

12. The filter device according to claim 8, wherein the second electrode film includes Al.

13. The filter device according to claim 8, further comprising a dielectric film between the first electrode film and the piezoelectric layer.

14. The filter device according to claim 8, wherein Euler angles ($\phi$, $\Theta$, $\Psi$) of the lithium niobate or the lithium tantalate of the piezoelectric layer are within a range of expression (1), expression (2), or expression (3):

$$(0°\pm10°, 0° \text{ to } 20°, \text{freely selected } \Psi) \qquad \text{expression (1);}$$

$$(0°\pm10°, 20° \text{ to } 80°, 0° \text{ to } 60°(1-(\Theta-50)^2/900)^{1/2}) \text{ or}$$
$$(0°\pm10°, 20° \text{ to } 80°, [180°-60°(1-(\Theta-50)^2/900)^{1/2}] \text{ to } 180°) \qquad \text{expression (2); and}$$

$$(0°\pm10°, [180°-30°(1-(\Psi-90)^2/8100)^{1/2}] \text{ to } 180°, \text{freely selected } \Psi) \qquad \text{expression (3).}$$

* * * * *